(12) United States Patent
Eyal et al.

(10) Patent No.: US 9,704,595 B1
(45) Date of Patent: Jul. 11, 2017

(54) SELF-DETECTING A HEATING EVENT TO NON-VOLATILE STORAGE

(71) Applicant: SanDisk Technologies Inc., Plano, TX (US)

(72) Inventors: Alon Eyal, Zichron Yaacov (IL); Idan Alrod, Herzliya (IL); Eran Sharon, Rishon Lezion (IL); Ishai Ilani, Dolev (IL); Mark Murin, Kfar Saba (IL); David Rozman, Kiryat-Malakhi (IL); Wei-Cheng Lien, San Jose, CA (US); Deepanshu Dutta, Fremont, CA (US); Changyuan Chen, San Ramon, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/087,242

(22) Filed: Mar. 31, 2016

(51) Int. Cl.
 *G11C 13/00* (2006.01)
 *G11C 16/34* (2006.01)
 *G11C 16/14* (2006.01)

(52) U.S. Cl.
 CPC .......... *G11C 16/3431* (2013.01); *G11C 16/14* (2013.01); *G11C 13/0004* (2013.01); *G11C 13/0007* (2013.01); *G11C 13/0069* (2013.01)

(58) Field of Classification Search
 CPC ............ G11C 13/0069; G11C 13/0004; G11C 13/0007

USPC ......................................................... 365/148
See application file for complete search history.

(56) References Cited

U.S. PATENT DOCUMENTS

| | | | |
|---|---|---|---|
| 8,179,717 B2 | 5/2012 | Shepard et al. | |
| 8,788,741 B2 | 7/2014 | Kwon et al. | |
| 9,036,396 B2 | 5/2015 | Heller et al. | |
| 9,037,946 B2 | 5/2015 | Jeon et al. | |
| 9,165,670 B2 | 10/2015 | Mekhanik et al. | |
| 2008/0059703 A1 | 3/2008 | Yoshioka et al. | |
| 2010/0169547 A1 | 7/2010 | Ou | |
| 2011/0107049 A1 | 5/2011 | Kwon et al. | |
| 2011/0199823 A1 | 8/2011 | Bar-or et al. | |
| 2014/0063900 A1* | 3/2014 | Heller | G01N 25/02 365/148 |

* cited by examiner

*Primary Examiner* — Jason Lappas
(74) *Attorney, Agent, or Firm* — Vierra Magen Marcus LLP

(57) ABSTRACT

Techniques are provided for non-volatile storage self-detecting that a heating event has occurred to the non-volatile storage. One example of the heating event is an Infrared (IR) reflow process. In one aspect, a block of memory cells in a memory device are put through a number of program/erase cycles. A group of the memory cells in the cycled block are programmed to a reference threshold voltage distribution. Some time may pass after programming the cycled block. The memory device self-detects that there has been a heating event in response to a shift in the reference $V_T$ distribution being more than an allowed amount. The memory device may switch from a first programming mode to a second programming mode in response to detecting that the heating event has occurred.

20 Claims, 19 Drawing Sheets

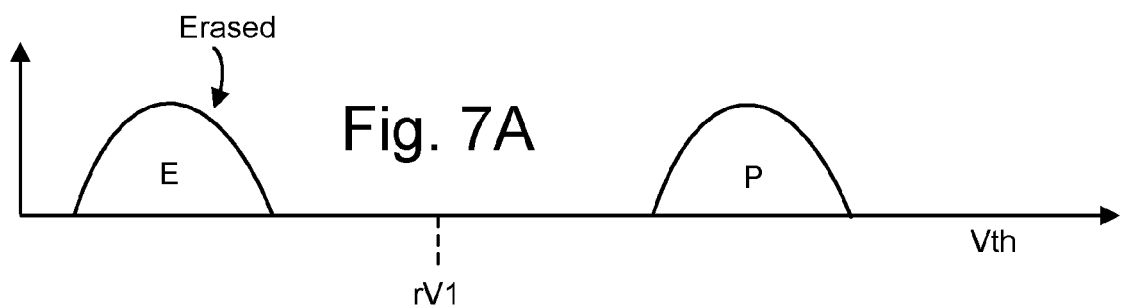
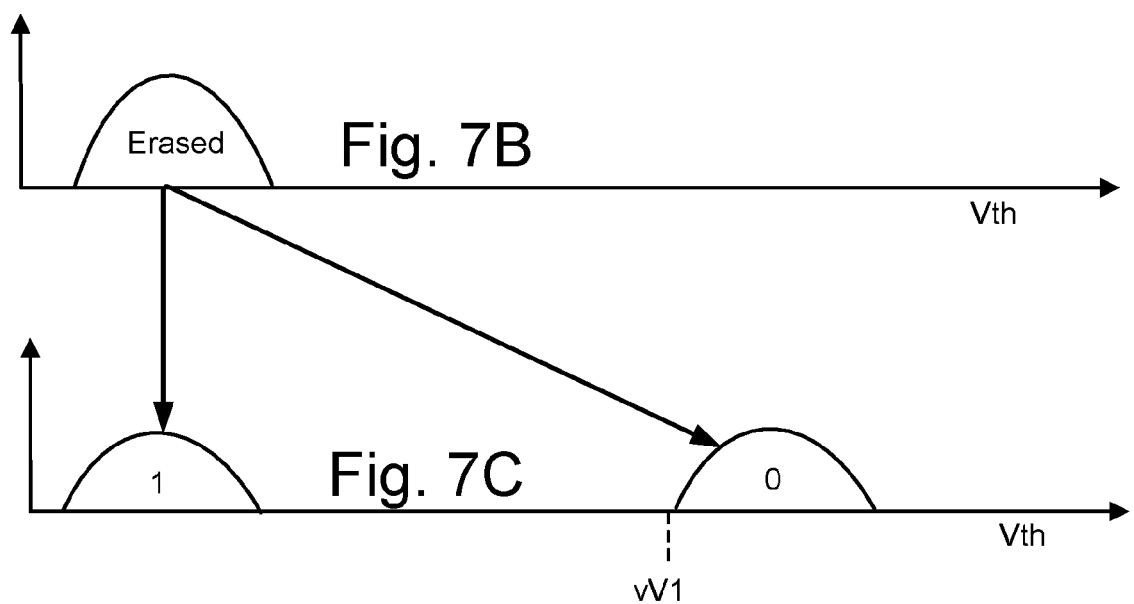

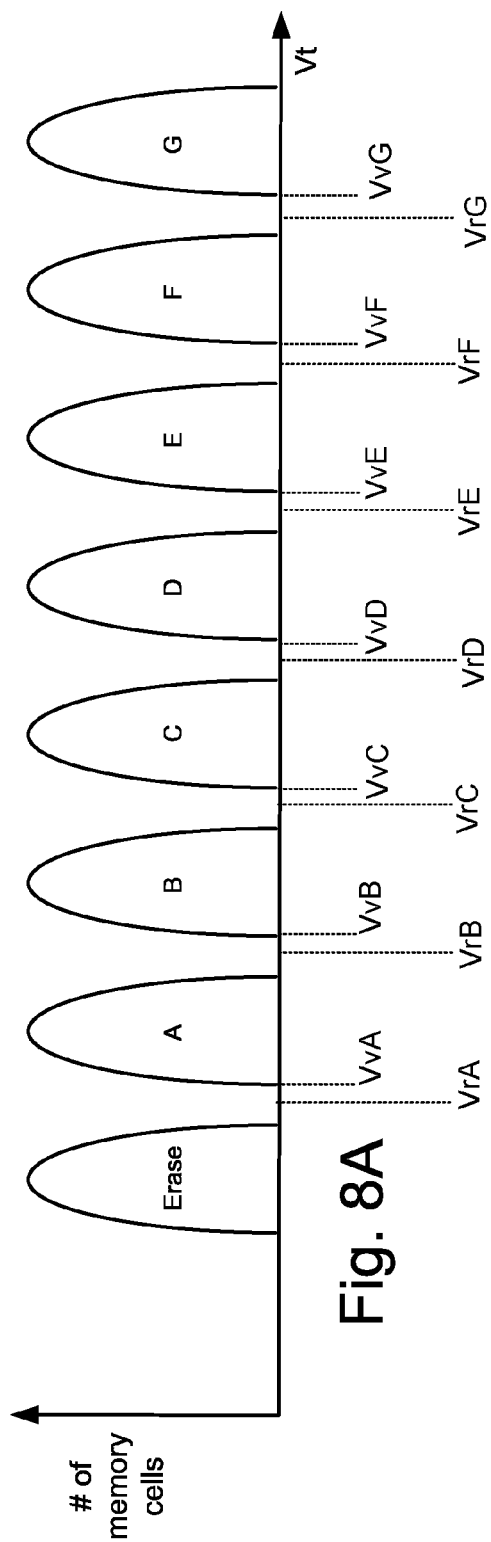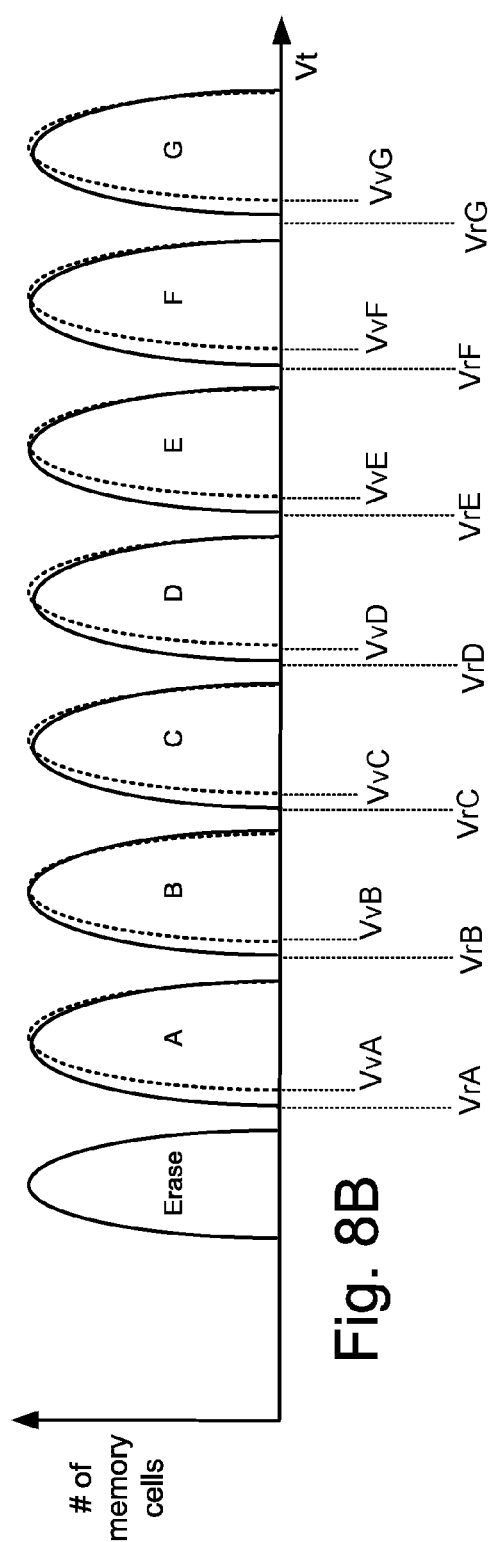
Fig. 8A
Fig. 8B

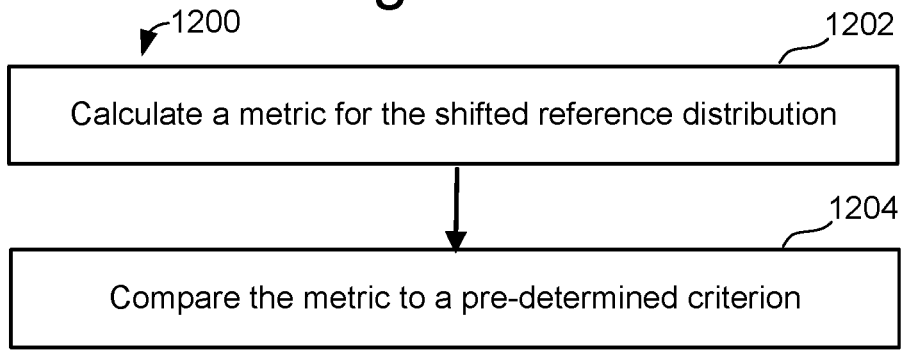
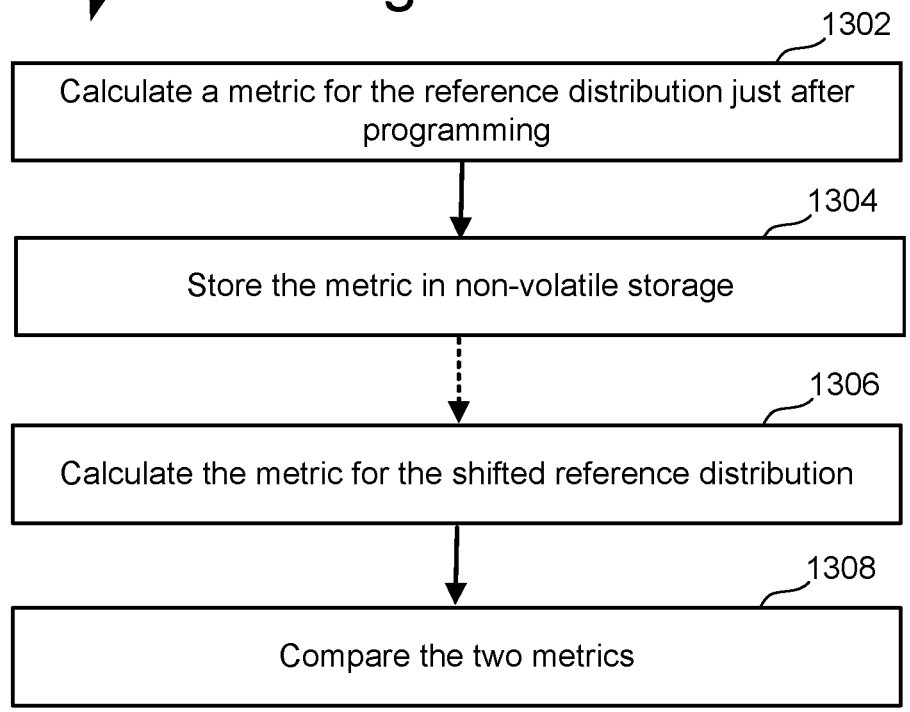

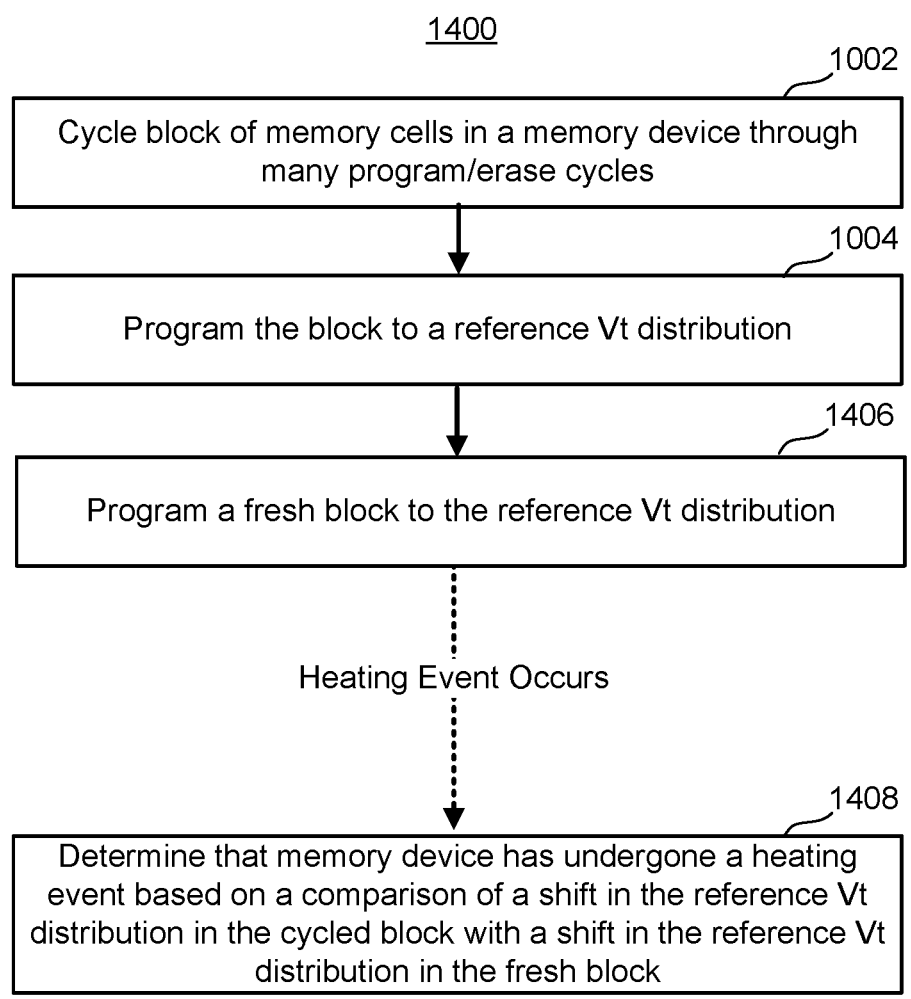

Figure 17A
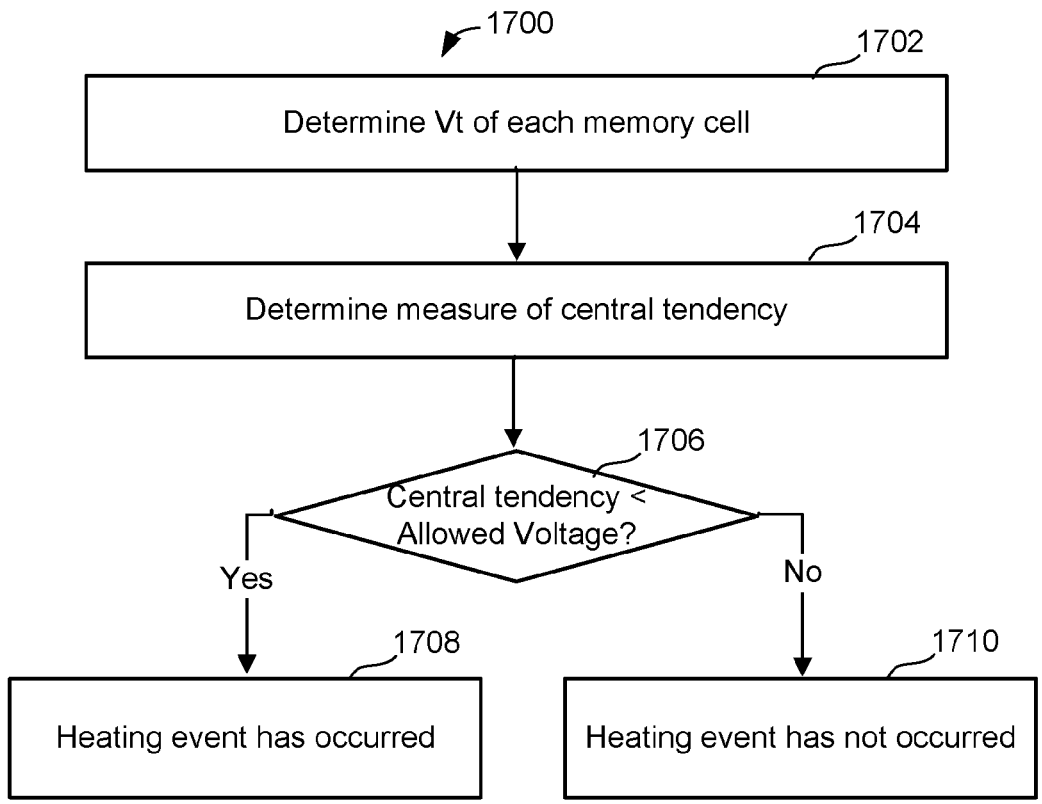
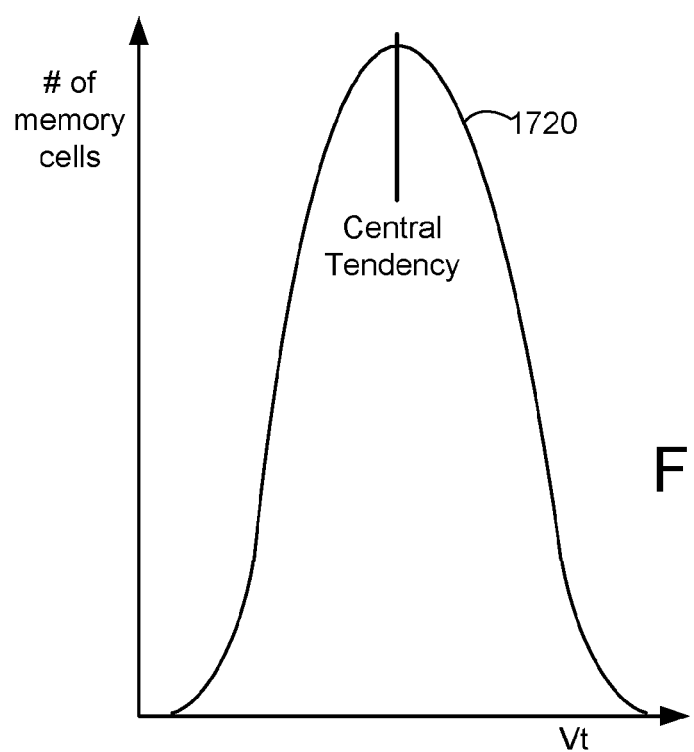
Fig. 17B

SELF-DETECTING A HEATING EVENT TO NON-VOLATILE STORAGE

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some non-volatile memory store information in a charge storage region that is insulated from a channel region in a semiconductor substrate. As one example, a floating gate is adjacent to and insulated from a channel region in a semiconductor substrate. The floating gate may be positioned between source and drain regions of a transistor formed by the memory cell. A control gate is provided adjacent to and insulated from the floating gate. The threshold voltage ($V_T$) of the memory cell transistor is controlled by the amount of charge that is retained on the floating gate. That is, the minimum amount of voltage that must be applied to the control gate before the transistor is turned on to permit conduction between its source and drain is controlled by the level of charge on the floating gate.

Some non-volatile memory utilizes a charge trapping layer as the charge storage region of the memory cell transistor to store information. One such example has an oxide-nitride-oxide (ONO) region, in which the nitride (e.g., SiN) serves as a charge trapping layer to store information. When such a memory cell is programmed, electrons are stored in the charge trapping layer. In this manner, the $V_T$ of the memory cell may be established.

To store one bit per memory cell, the memory cells may be programmed to two distinct distributions of threshold voltages. To store two-bits per memory cell, the memory cells may be programmed to four distinct distributions of threshold voltages. To store three-bits per memory cell, the memory cells may be programmed to eight distinct distributions of threshold voltages. Over time, a memory cell may lose charge from the charge storage region, which may cause its $V_T$ to drop. If the memory cell loses enough charge, its $V_T$ may drop below the $V_T$ distribution to which it was originally programmed. This is referred to as a data retention issue.

Non-volatile memory could have a 2D architecture or a 3D architecture. Recently, ultra-high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. Control gates of the memory cells are provided by the conductor layers.

BRIEF DESCRIPTION OF THE DRAWINGS

Like-numbered elements refer to common components in the different figures.

FIG. 7A-7C illustrate an example of a population of two-state memory cells (Single Level Cells, or "SLC" cells).

FIG. 8A illustrates example $V_T$ distributions corresponding to data states for the memory cell array when each memory cell stores three bits of data.

FIG. 8B shows $V_T$ distributions illustrating charge loss for memory cells in the A-state through the G-state.

FIG. 12 is a flowchart of one embodiment of a process for determining that a heating event has occurred based on comparing a metric for a shifted reference $V_T$ distribution with a pre-determined criterion.

FIG. 13 is a flowchart of one embodiment of a process for determining that a heating event has occurred based on a metric for a reference $V_T$ distribution in a cycled block just after programming.

FIG. 14 is a flowchart of one embodiment of a process that determines whether a heating event occurred based on a comparison of a shift in a reference $V_T$ distribution for a cycled block with a shift in a reference $V_T$ distribution in a fresh block.

FIG. 17A is a flowchart of one embodiment of a process for determining whether a heating event has occurred based on a location of a measure of central tendency of the reference $V_T$ distribution.

FIG. 17B shows a reference $V_T$ distribution at the time that the memory cells were sensed in step 1702 of the process of FIG. 17A.

DETAILED DESCRIPTION

Figure 1:
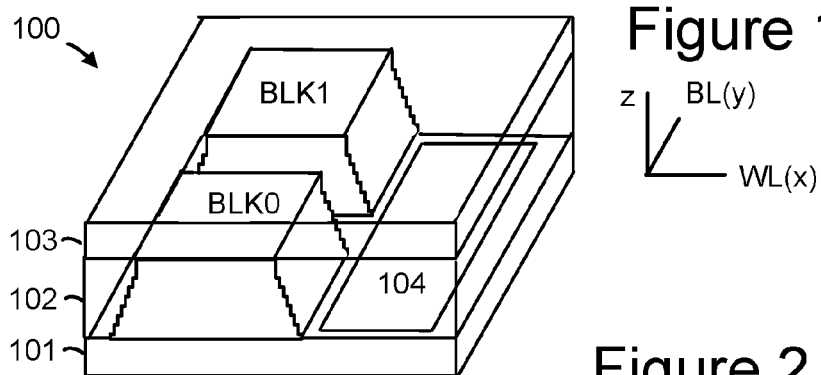
FIG. 1 is a perspective view of a 3D stacked non-volatile memory device.

Techniques are provided for a non-volatile storage device self-detecting that a heating event has occurred to the non-volatile storage device. One example of the heating event is an Infrared (IR) reflow process. An IR reflow process may be used to attach a surface mount device that houses the non-volatile storage device to a printed circuit board, or the like. For example, a ball-grid array (BGA) package may employ hundreds of tiny solder balls on the bottom of the package to provide the leads needed to connect to sophisticated integrated circuits. Solder reflow is a process in which solder paste is used to temporarily attach an electrical component to contact pads. Then, controlled heat is used to melt the solder, permanently connecting the electrical component to the contact pads. The heating can use a high temperature profile that could be accomplished by passing the package through a reflow oven or using an infrared lamp. The temperature could reach 260 degrees Celsius, in one example process.

The effect of the high heat on memory devices including, but not limited to, flash memory devices may be similar to the data loss that occurs over time due to the data retention issue mentioned above. The effect of the soldering process could be similar to several years of data loss without extreme heating. The brief high temperature may accelerate charge loss from the charge storage regions.

Typically, memory devices have some data programmed therein even prior to soldering the memory devices to the host device. For example, an operating system may be stored in the memory device at time of manufacture. Therefore, the soldering process could degrade data retention or even cause data loss.

In order to minimize damage due to a heating event such as, but not limited to, IR reflow, data can be written to the device in a "safe mode" at manufacture. The safe mode could store just one bit per memory cell, as opposed to multiple bits per memory cell. It is also possible for the safe mode to store more than one bit per memory cell. If so, the safe mode might be sure to have better margins between $V_T$ distributions of the various data states at the expense of writing more slowly.

In contrast, after the memory device has been soldered to its host, data programming can change from the safe mode to a "normal mode." In the normal mode, instead of storing a single bit per memory cell, multiple bits could be stored per memory cell. This could include re-writing data at a greater density to save storage space. For example, the operating system might be stored at one bit per memory cell in the safe mode, but re-written as multiple bits per memory cell in the normal mode. Another option for the normal mode is to increase the programming speed at the risk of smaller margins between data states.

If the memory device stays in the safe mode after it is soldered to the host, the memory device will not perform as efficiently. On the other hand, if the memory device switches from a safe programming mode to a normal programming mode in response to a false detection of being soldered to the host, the memory device could fail.

As noted above, techniques are disclosed herein for detecting that a heating event, such as an IR reflow, has occurred. This detection is complicated by the fact that considerable time may pass between device manufacture and soldering the memory device to the host. There will typically be some charge loss during that time due to the data retention issue. Moreover, since the memory device is typically not under control of the manufacturer during this time, the memory device could be subject to moderately hot environmental conditions (but far below the soldering temperatures), which could further increase charge loss due to the data retention issue. Thus, it can be difficult to distinguish the difference between the effects of the heating event and the data retention issue.

Also complicating detection is the fact that the memory device may undergo more than one heating event. For example, two sides of the memory device could be soldered during two separate IR reflow processes. Also, one of the IR reflow processes might be repeated. Thus, the memory device might undergo one, two, three, or some other number of heating events, such as IR reflow processes.

As noted, techniques for self-detecting a heating event are disclosed herein. In one embodiment, a block of memory cells in a memory device are put through a number of program/erase cycles. A group of the memory cells in the cycled block are programmed to a reference $V_T$ distribution. Some time may pass after programming the cycled block. The memory device self-detects that there has been a heating event (e.g., an IR reflow) in response to a shift in the reference $V_T$ distribution being more than an allowed amount. The memory device may switch from a first programming mode to a second programming mode in response to detecting that the heating event has occurred.

In one embodiment, detecting the heating event includes calculating a metric that characterizes the shift in the reference $V_T$ distribution, and comparing the metric to a pre-determined criterion. The pre-determined criterion may be a value for the metric that indicates that the shift in the reference $V_T$ distribution indicates that a heating event occurred. The pre-determined criterion may be a value for the metric that allows the memory device to distinguish between a heating event and a data retention issue.

In one embodiment, detecting the heating event includes calculating a metric that characterizes the reference $V_T$ distribution for a cycled block just after programming. That metric may be stored and compared to a value for the same metric after the reference $V_T$ distribution has shifted. A shift in the metric by more than an allowed amount indicates the heating event has occurred. The allowed amount of shift in the metric may be such that memory device is able to distinguish between a heating event and a data retention issue. Moreover, by using the metric that characterizes the reference $V_T$ distribution for the cycled block just after programming, device to device variations may be reduced or eliminated.

In one embodiment, detecting the heating event includes programming memory cells in a fresh block to the reference $V_T$ distribution at the same time that the cycled block is programmed to the reference $V_T$ distribution. The memory device compares a shift in the reference $V_T$ distribution of the fresh block with a shift in the reference $V_T$ distribution of the cycled block in order to determine whether a heating event has occurred.

In some embodiments, techniques disclosed herein are applied in a 3D stacked non-volatile memory device. The following is one example of a 3D stacked non-volatile memory device. Embodiments disclosed herein are not limited to this 3D example. Embodiments disclosed herein are not limited to 3D memory. For example, techniques disclosed herein may also be used in 3D memory, such as but not limited to, 2D NAND. Embodiments are not limited to NAND.

The following discussion provides details of one example of a suitable structure for a memory devices that can implement the proposed technology. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
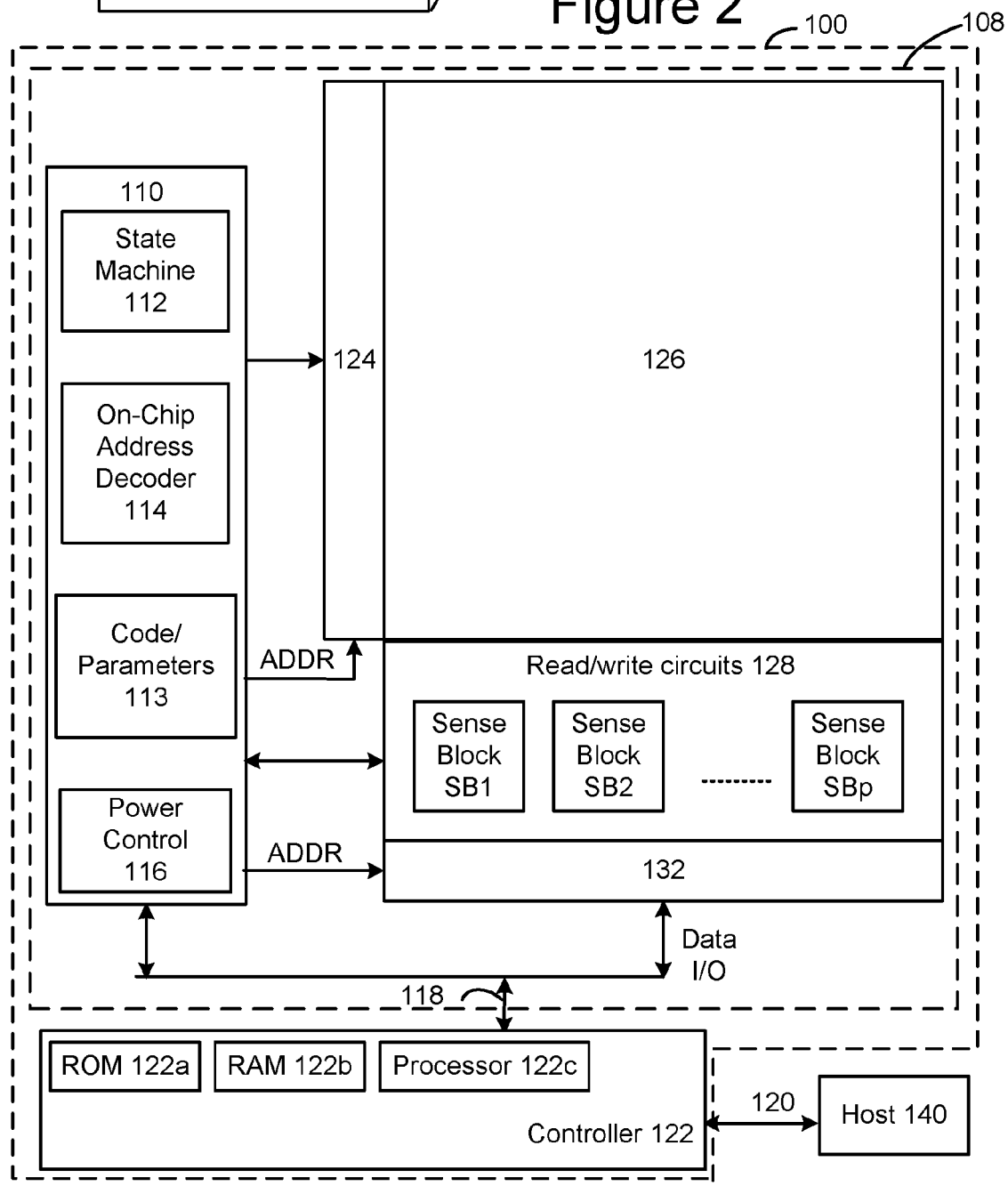
FIG. 2 is a functional block diagram of a memory device such as the 3D stacked non-volatile memory device of FIG. 1.

FIG. 2 is a functional block diagram of an example memory device such as the 3D stacked non-volatile memory device 100 of FIG. 1. Memory device 100 includes one or more memory die 108. Each memory die 108 includes a three-dimensional memory structure 126 of memory cells (such as, for example, a 3D array of memory cells), control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address (e.g., ADDR) used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, storage 113, power control module 116, sense blocks SB1, SB2, . . . , SBp, read/write circuits 128, and controller 122 can be considered a managing circuit that performs the functions described herein.

The (on-chip or off-chip) controller 122 may comprise a processor 122c and storage devices (memory) such as ROM 122a and RAM 122b. The storage devices comprise code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Other types of non-volatile memory in addition to NAND flash memory can also be used.

The memory elements can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

A person of ordinary skill in the art will recognize that this technology is not limited to a single specific memory structure, but covers many relevant memory structures within the spirit and scope of the technology as described herein and as understood by one of ordinary skill in the art.

Figure 3:
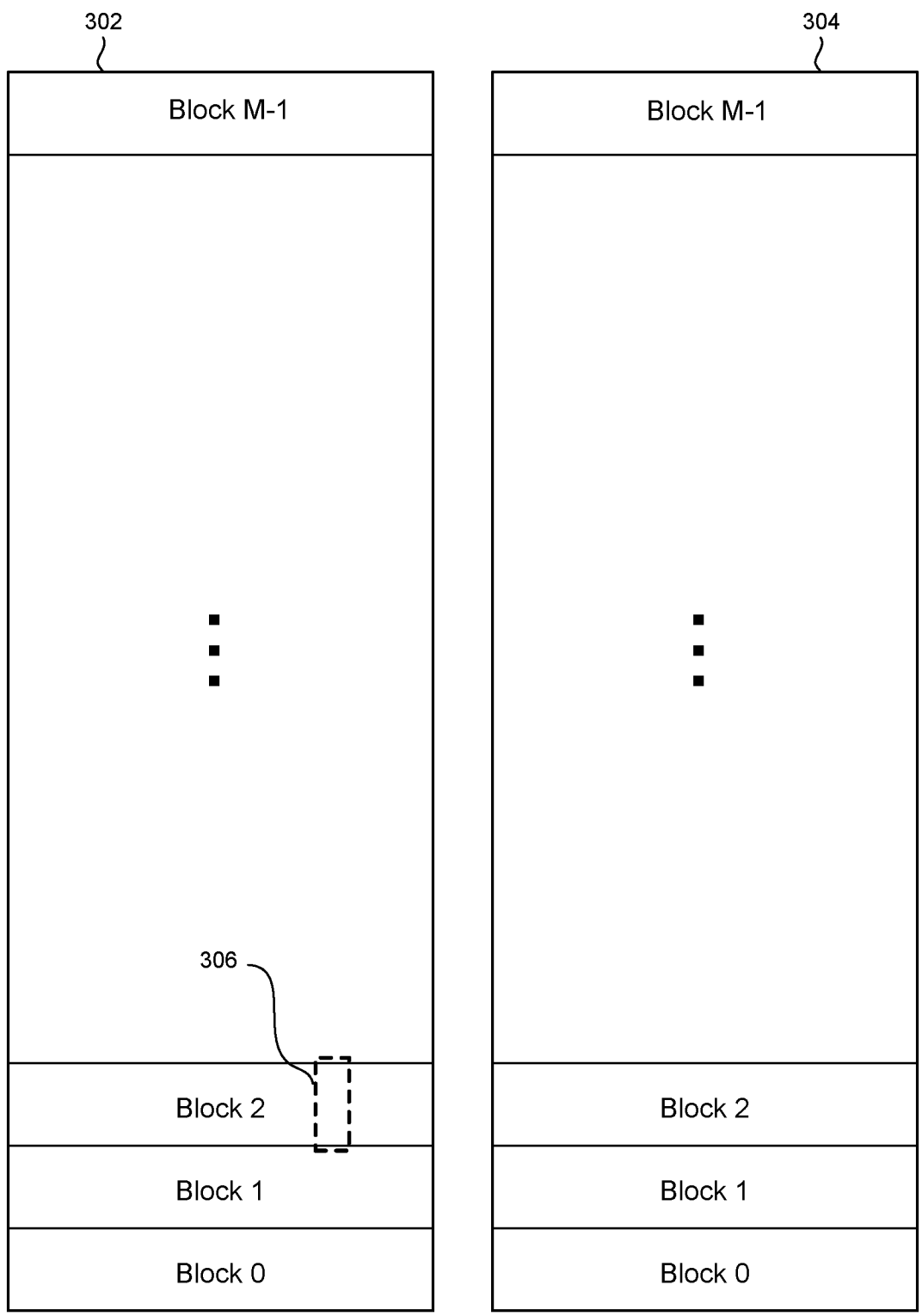
FIG. 3 is a block diagram of a memory structure having two planes.

FIG. 3 is a block diagram explaining one example organization of memory structure 126, which is divided into two planes 302 and 304. Each plane is then divided into M blocks. In one example, each plane has about 2000 blocks. However, different numbers of blocks and planes can also be used.

Figure 4A:
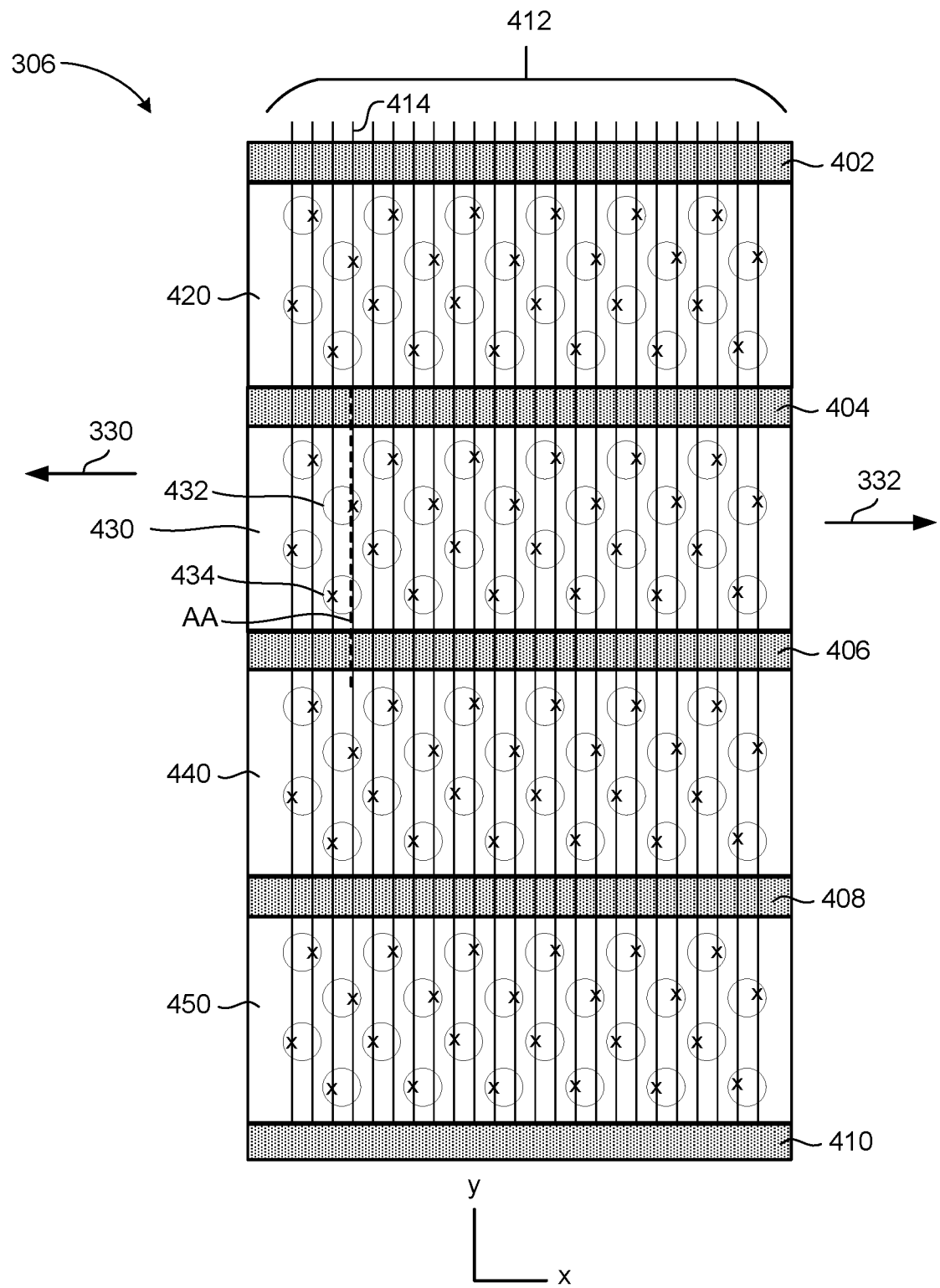
FIG. 4A depicts a top view of a portion of a block of memory cells.

FIG. 4A is a block diagram depicting a top view of a portion of one block from memory structure 126. The portion of the block depicted in FIG. 4A corresponds to portion 306 in block 2 of FIG. 4A. As can be seen from FIG. 4A, the block depicted in FIG. 4A extends in the direction of arrow 330 and in the direction of arrow 332. In one embodiment, the memory array will have 48 layers. Other embodiments have less than or more than 48 layers. However, FIG. 4A only shows the top layer.

FIG. 4A depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4A extends in the direction of arrow 330 and in the direction of arrow 332, the block includes more vertical columns than depicted in FIG. 4A.

FIG. 4A also depicts a set of bit lines 412. FIG. 4A shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4A includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4A is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the managing circuit uses the source side select lines and the drain side select lines to choose one (or another subset) of the four to be subjected to a memory operation (program, verify, read, and/or erase).

Although FIG. 4A shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4A also shows the vertical columns being staggered. In other embodiments, different patterns of staggering can be used. In some embodiments, the vertical columns are not staggered.

Figure 4B:
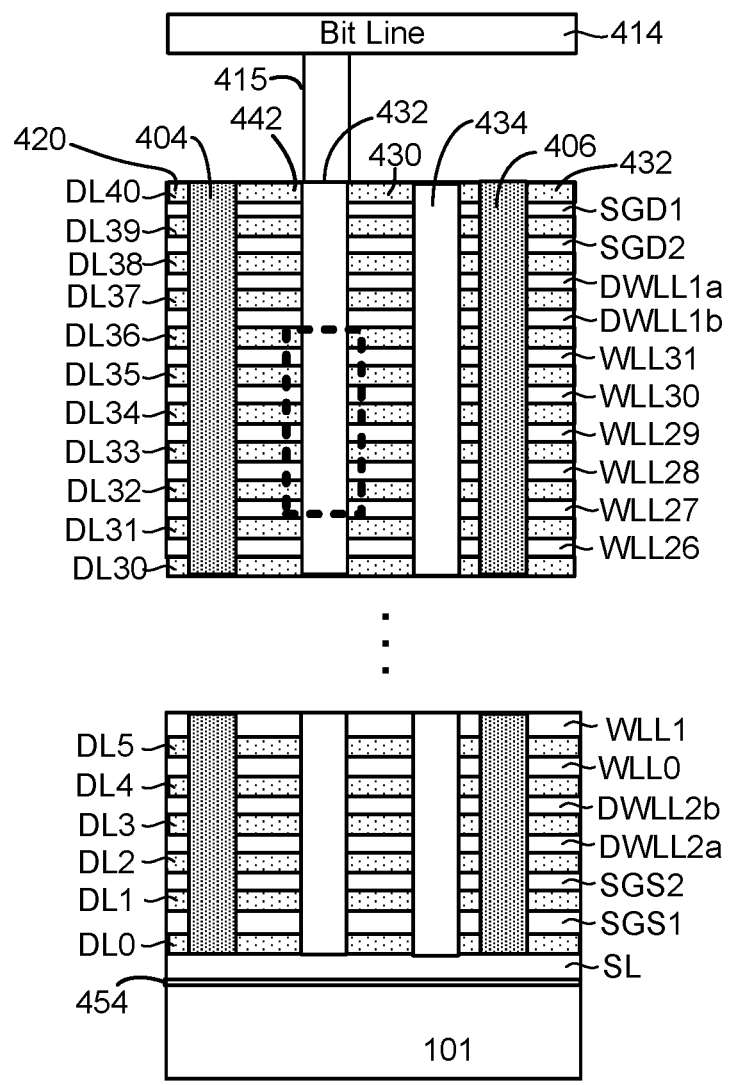
FIG. 4B depicts a cross sectional view of a portion of a block of memory cells.

FIG. 4B depicts a portion of an embodiment of three dimensional memory structure 126 showing a cross-sectional view along line AA of FIG. 4A. This cross sectional view cuts through vertical columns 432 and 434 and region 430 (see FIG. 4A). The structure of FIG. 4B includes two drain side select layers SGD1 and SGD1; two source side select layers SGS1 and SGS2; four dummy word line layers DWLL1a, DWLL1b, DWLL2a and DWLL2b; and thirty two word line layers WLL0-WLL31 for connecting to data memory cells. Other embodiments can implement more or less than two drain side select layers, more or less than two source side select layers, more or less than four dummy word line layers, and more or less than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG.

4A, FIG. 4B show vertical column 432 connected to Bit Line 414 via connector 415. Local interconnects 404 and 406 are also depicted.

For ease of reference, drain side select layers SGD1 and SGD1; source side select layers SGS1 and SGS2; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL40. For example, dielectric layers DL31 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, while a data memory cell is eligible to store user data. Thus, data memory cells may be programmed. Drain side select layers SGD1 and SGD1 are used to electrically connect and disconnect NAND strings from bit lines. Source side select layers SGS1 and SGS2 are used to electrically connect and disconnect NAND strings from the source line SL.

Figure 4C:
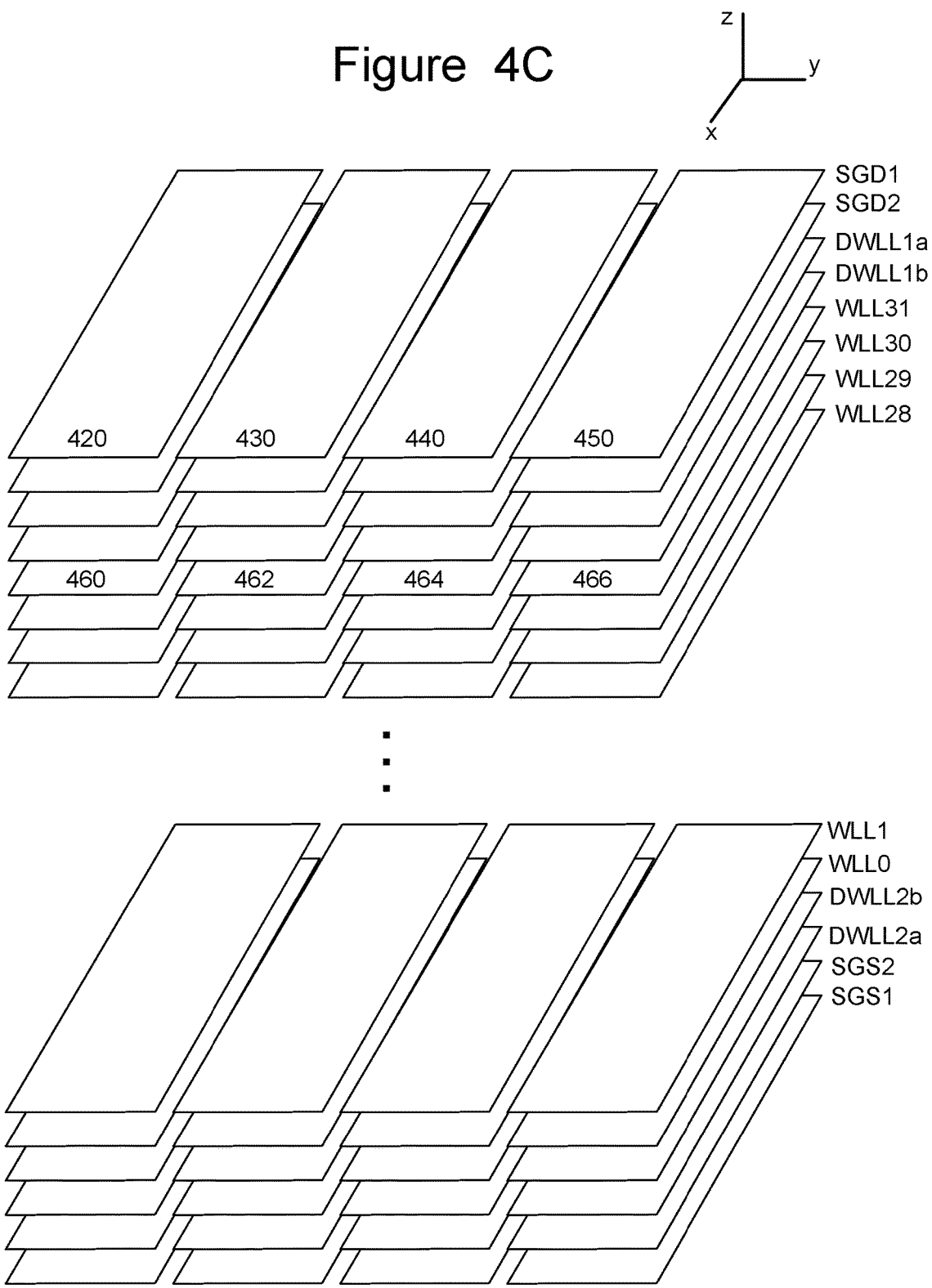
FIG. 4C depicts a view of the select gate layers and word line layers.

FIG. 4C depicts a perspective view of the conductive layers (SGD1, SGD1, SGS1, SGS2; DWLL1a, DWLL1b, DWLL2a, DWLL2b, and WLL0-WLL31) for the block that is partially depicted in FIG. 4C. As mentioned above with respect to FIG. 4A, local interconnects 401, 404, 406, 408 and 410 break up each conductive layers into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL31), the regions are referred to as word line fingers; for example, word line layer WLL31 is divided into word line fingers 460, 462, 464 and 466.

Figure 4D:
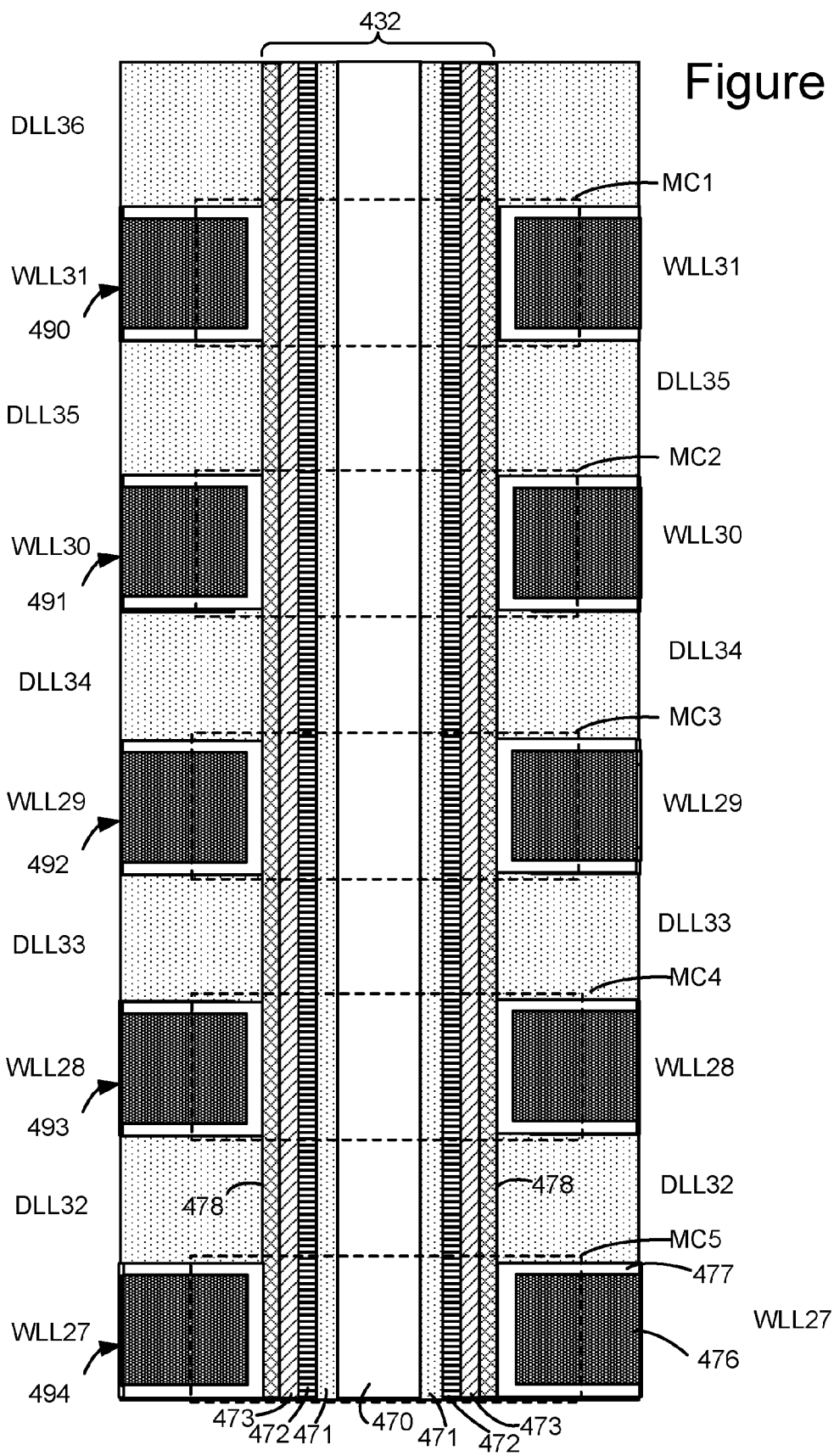
FIG. 4D is a cross sectional view of a vertical column of memory cells.

FIG. 4D depicts a cross sectional view of region 442 of FIG. 4B that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 4D depicts dielectric layers DLL32, DLL33, DLL34, DLL35 and DLL36, as well as word line layers WLL27, WLL28, WLL29, WLL30, and WLL31. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage ($V_T$) of a memory cell is increased in proportion to the amount of stored charge. During an erase operation, the electrons return to the channel.

Figure 5:
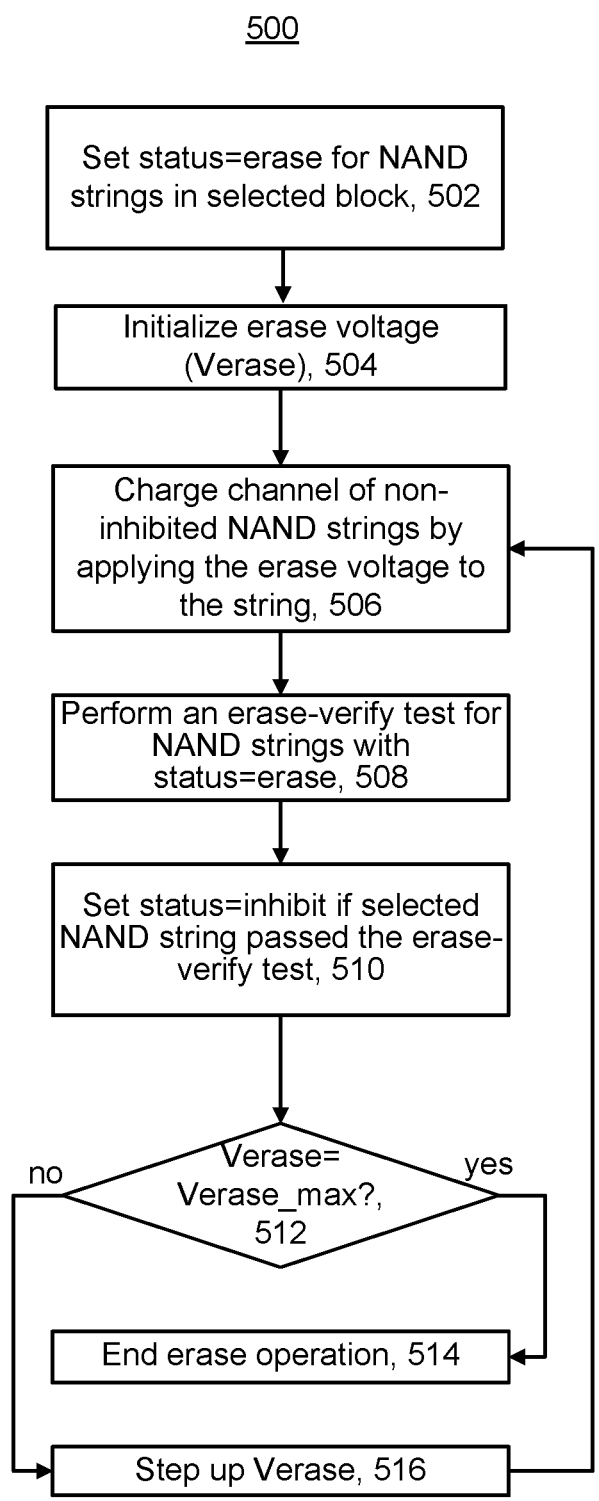
FIG. 5 depicts a flowchart of an example erase process for erasing NAND strings in a block.

FIG. 5 depicts a flowchart of an example erase process 500 for erasing NAND strings in a block. This process 500 may be used for the example 3D architecture described herein. Generally, an erase operation can include multiple erase-verify iterations which are performed until a verify condition is met, at which point the erase operation ends. In one approach, the memory device includes NAND strings which have a drain-side select gate (SGD) transistor on one end and a source-side select gate (SGS) transistor on the other end. The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Step 502 sets status=erase for the NAND strings that are in the selected block. Note that status data can be maintained indicating whether the NAND string has a status of "inhibited," which indicates that the NAND string is to be inhibited from further erasing in the erase portion of a successive erase iteration of the erase operation, or a status of "erase," (or "uninhibited") which indicates that the NAND string is not to be inhibited from further erasing in the erase portion of a successive erase iteration of the erase operation (that is, the string is to continue to undergo erasing). The status data can be maintained by the on-chip control circuitry 110 or the off-chip controller 122, for instance, and updated based on results of a verify test of each erase iteration.

Step 504 initializes an erase voltage (Verase) to a starting value. Step 506 charges the channel of the non-inhibited NAND strings by applying the erase voltage to the non-inhibited NAND strings. In one embodiment, the erase voltage is applied to the bit lines for a one-sided erase. In one embodiment, the erase voltage is applied to the bit line and source line for a two-sided erase. Note that for some architectures, both inhibited and non-inhibited NAND strings may be associated with the same bit line. Thus, the erase voltage is applied to bit lines of non-inhibited NAND strings, and may be applied to bit lines of inhibited NAND strings, in one embodiment. A suitable voltage may be applied to the select gate line (SGD) of non-inhibited NAND strings to cause a drain-to-gate voltage (Vdg) of the select gate transistors to generate a desired amount of GIDL. A suitable voltage may be applied to the select gate line (SGD) of inhibited NAND strings to cause a drain-to-gate voltage (Vdg) of the select gate transistors to prevent GIDL. In one embodiment, the word line voltages in the block undergoing erase are set to a voltage to encourage erasing.

Step 508 performs an erase-verify test for storage elements in the block (for the non-inhibited NAND strings). The erase-verify test can be performed concurrently for the different storage elements on the string in the block. For example, this can involve applying a common erase-verify control gate voltage (Vv_erase) to the control gate of each storage element in the block while detecting the current through the respective non-inhibited NAND strings.

If the current of the string is above a reference current, indicating the string is conductive, the erase-verify test is passed for that string. Step 510 sets status=inhibit if the NAND string passed the erase-verify test. The erase status=erase is continued if the NAND string does not pass the erase-verify test.

Decision step 512 determines if Verase is at Verase_max. If the answer is "yes," the erase operation ends unsuccessfully at step 514. If the answer is "no," Verase is stepped up at step 516 and another iteration is performed at step 506.

Note that there a many possible erase techniques that can be used. The erase process can be performed on just a subset of NAND strings in the block, in some embodiments. In one embodiment, the memory cells are formed in or above a p-well. For example, in a 2D memory array, the memory cells may be formed in a p-well. In a 3D memory array, the memory cells may be formed above a p-well. The erase may be achieved by raising the p-well to an erase voltage for a sufficient period of time and grounding the word lines of a selected block while the select lines, the common source line and bit lines are floating. Due to capacitive coupling, the bit lines, select lines, and the common source line may also be raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the charge storage regions to the p-well region, the $V_T$ of a selected cell is lowered. Erasing can be performed on the entire memory array, on individual blocks, or another unit of cells.

Figure 6:
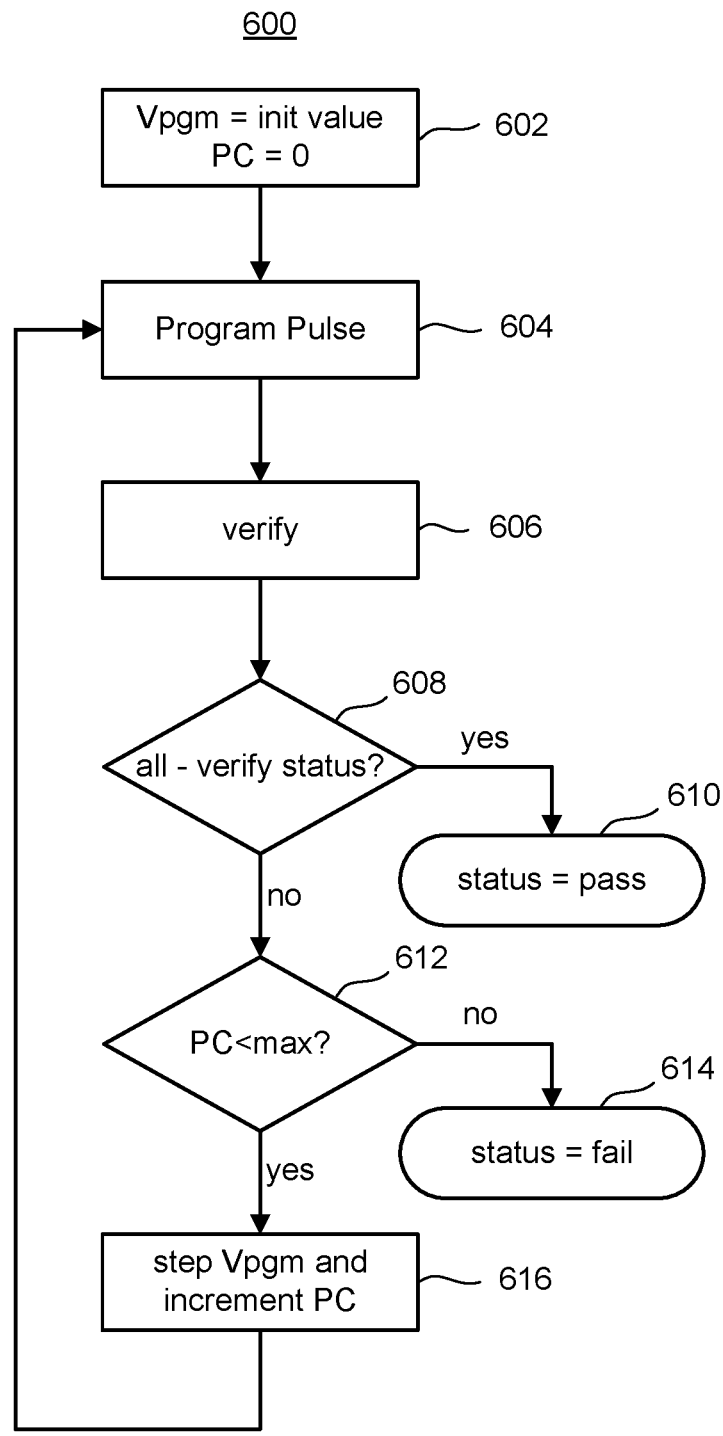
FIG. 6 is a flowchart describing one embodiment of a programming process, which includes one or more verification steps.

FIG. 6 is a flowchart describing one embodiment of a programming process 600, which includes one or more verification steps. The programming process 600 may be performed after the memory cells have been erased. Typically, the programming process 600 is performed on a set of memory cells within a selected block. One possibility is to apply the process 600 to a group of memory cells within the selected block that are connected to the same word line. This process could be used when programming memory cells to two different states, four different states, eight different states, or some other number of different states.

In step 602, the program voltage (Vpgm) is set to an initial value. Also, in step 602, a program counter (PC) is initialized to zero. In step 604, a program pulse is applied to control gates of memory cells. Step 604 may also include establishing programming conditions on bit lines. Bit lines associated with memory cells to receive programming may be provided with a program enable voltage; bit lines associated with memory cells to be prevented from programming may be provided with a program disable voltage.

In step 606, a verification process is performed. The verification process may involve applying reference verify voltages to the selected word line. In step 608, it is determined whether memory cells have verified that their threshold voltages are at the final target voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed. Step 608 is referring to all states having completed programming.

If verification passes, the programming process is completed successfully (status=pass) in step 610. If all of the memory cells are not all verified, then it is determined whether the program counter (PC) is less than a maximum value such as 20. If the program counter (PC) is not less than max (step 612), then the program process has failed (step 614). If the program counter (PC) is less than a maximum value (e.g., 20), then the program counter (PC) is incremented by 1 and the program voltage is stepped up to the next pulse in step 616. Subsequent to step 616, the process loops back to step 604 and the next program pulse is applied to the memory cells.

At the end of a successful programming process (with verification), the threshold voltages of the memory cells should be within one or more distributions of threshold voltages for programmed memory cells or within a distribution of threshold voltages for erased memory cells, as appropriate.

FIG. 7A-7C illustrate an example of a population of two-state memory cells (Single Level Cells, or "SLC" cells). FIG. 7A illustrates how the population of memory cells are programmable into two distinct distributions of threshold voltages, an erased state, "E" and a programmed state, "P." Memory cells may be read by determining whether their threshold voltages are above or below a read voltage, rV1. FIG. 7B illustrates the initial distribution of "erased" threshold voltages for an erased memory. FIG. 7C illustrates an example of the memory after many of the memory cells have been programmed. Essentially, a cell initially has an "erased" threshold voltage and programming will move it to a higher value into a zone demarcated by verify level vV1. In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

FIG. 8A illustrates example $V_T$ distributions corresponding to data states for the memory cell array when each memory cell stores three bits of data. Other embodiments, however, may use more or fewer than three bits of data per memory cell. One axis represents the number of memory cells. This may be a logarithmic scale. The other axis represents threshold voltage ($V_T$) of the memory cells.

FIG. 8A shows eight $V_T$ distributions corresponding to an Erase state and programmed states A-G. In one embodiment, the threshold voltages in the Erase state are negative and the threshold voltages in the programmed states A-G are positive. However, the threshold voltages in one or more of programmed states A-G may be negative. Some or all of the threshold voltages in the Erase state could be positive.

At or near the lower edge of the threshold distribution for each programmed state is a verify reference voltage. For example, FIG. 8A shows VvA for the A-state, VvB for the B-state, VvC for the C-state, VvD for the D-state, VvE for the E-state, VvF for the F-state, and VvG for the G-state. When programming memory cells to a given state, the managing circuit will test whether those memory cells have a threshold voltage greater than or equal to the verify reference voltage.

Between each adjacent pair of the $V_T$ distributions are read reference voltages used for reading data from memory cells. For example, FIG. 8A shows read reference voltage VrA between the erase state and the A-state, VrB between the A-state and B-state, VrC between the B-state and C-state, VrD between the C-state and D-state, VrE between the D-state and E-state, VrF between the E-state and F-state, and VrG between the F-state and G-state. By testing whether the $V_T$ of a given memory cell is above or below the respective read reference voltages, the managing circuit can determine what state the memory cell is in. For example, a memory cell whose $V_T$ is greater than VrD, but less them VrE may be assumed to be in the D-state.

Note that the $V_T$ distributions in FIG. 8A are somewhat idealized in that none of the memory cells are under-programmed or over-programmed. An example of over-programming is when programming a memory cell to the A-state its threshold voltage may unintentionally go above VrB. An example of under-programming is when programming a memory cell to the B-state its threshold voltage may not quite reach the VrB level. In each case, this does not mean that programming has failed. An error correction algorithm can handle a certain percentage of cells whose threshold voltage is not in their intended $V_T$ distribution.

Also note that contrary to the equal spacing/width of the depicted threshold voltage distributions, various distributions may have different widths/spacings in order to accommodate varying amounts of susceptibility to data retention loss, as well as other factors.

The amount of the charge in the individual charge storage regions might not stay fixed. One possible effect is for charges to leak from the charge storage regions over time. A heating event, such as IR reflow, could cause also a substantial charge loss. FIG. 8B shows $V_T$ distributions illustrating charge loss for memory cells in the A-state through the G-state. The dashed $V_T$ distributions represent the $V_T$ distributions for the A-state through the G-state immediately after programming. The solid lines represent the shift to the $V_T$ distributions for the A-state through the G-state.

In this example, the shift lowers the $V_T$ distributions for the A-state through the G-state. In this example, the lower tail is shifted downward (e.g., has a lower $V_T$). However, the upper tail remains about the same, in this example. Note that if effects such as program disturb were to occur, this could shift the upper tails of the $V_T$ distributions to a higher $V_T$. However, the program disturb effect is not depicted in FIG. 8B.

Thus, memory cells have a limited ability to retain charge over time, which may be referred to as a "data retention" issue. Typically, memory cells will lose charge very slowly over a long period of time. When a memory device is subjected to a heating event, such as IR reflow, the memory cells could suffer a significant charge loss. Note that some time may pass between device manufacture and the heating event (e.g., IR reflow). Thus, both the data retention issue and the heating event could cause memory cell charge loss, resulting in a shift of a $V_T$ distribution of a group of memory cells. Some manufactures may suggest that if a heating event such as IR reflow is to be done, that it be performed within a certain period of time (e.g., within one year of memory device manufacture). However, the length of time between device manufacture and the heating event may be indeterminate. Therefore, the amount of charge loss due to the data retention issue may be indeterminate.

Figure 9A:
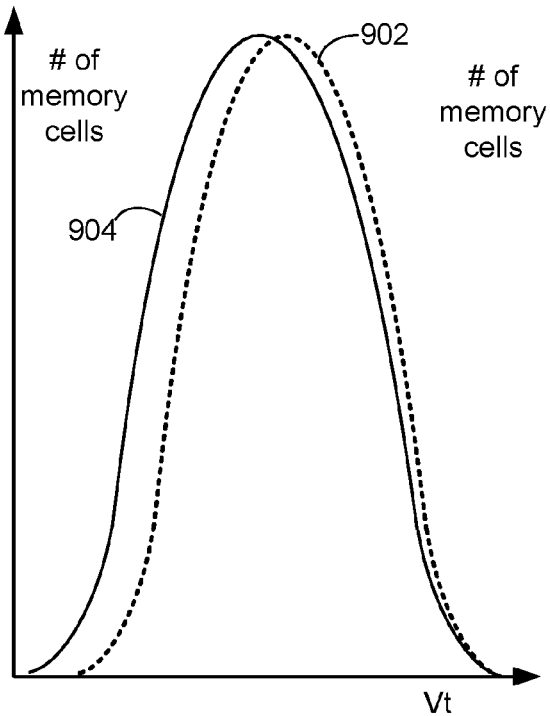
FIGS. 9A-9D are diagrams of $V_T$ distributions to help illustrate how a shift in $V_T$ distribution due to a heating event may be distinguished from a data retention issue.
Figure 9B:
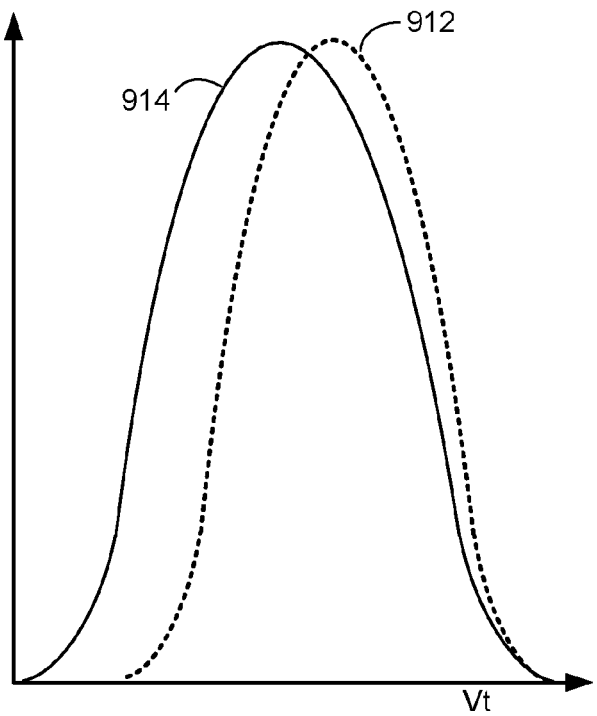
Figure 9C:
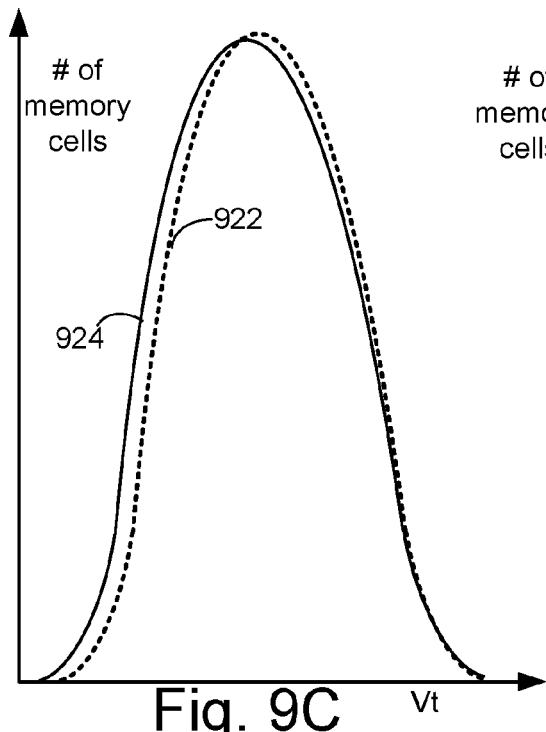
Figure 9D:
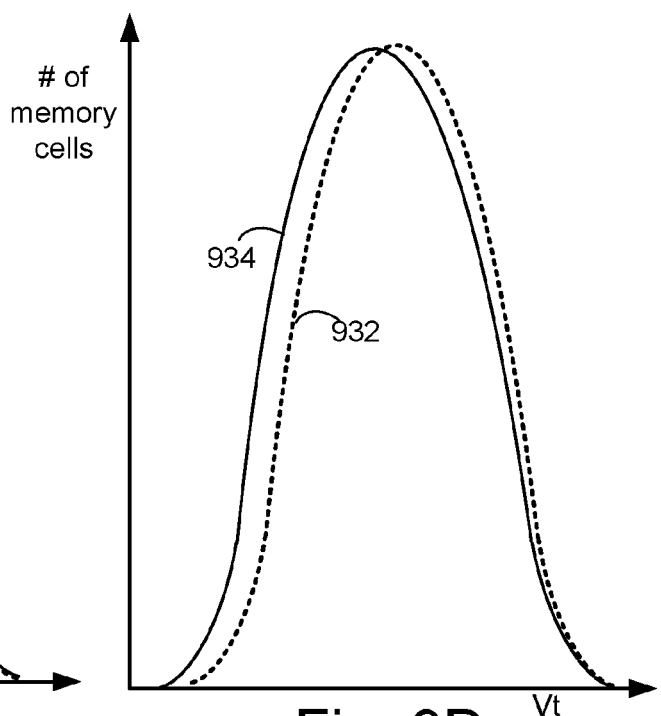

Embodiments disclosed herein include a memory device and method that are able to distinguish between a shift in $V_T$ distribution due to a heating event and a data retention issue. FIGS. 9A-9D will be used to help illustrate how a shift in $V_T$ distribution due to a heating event may be distinguished from a data retention issue. FIGS. 9A-9D each show two $V_T$ distributions to illustrate a possible shift in a $V_T$ distribution after programming. Thus, one $V_T$ distribution in each Figure is for just after programming, and the other is the shifted $V_T$ distribution. FIGS. 9A and 9B illustrate a possible shift in the $V_T$ distribution due to a heating event, such as IR reflow. FIGS. 9C and 9D illustrate a possible shift in the $V_T$ distribution due to charge loss that normally occurs over time. Two of the Figures (FIGS. 9A and 9C) represent cases for which the memory cells were not cycled prior to programming. The other two Figures (FIGS. 9B and 9D) represent cases for which the memory cells were cycled many times prior to programming. A cycle here includes a program operation and an erase operation, which may be referred to as a "P/E cycle." For example, after programming a group of memory cells, they may be erased to prepare for the next program operation.

Cycling the memory cells may physically change the memory cells, and hence may change the ability to retain charge. For example, the dielectric material adjacent to the charge trapping regions of the memory cells may degrade as a result of the high voltages applied during program and/or erase. Charge traps could be created in the dielectric material adjacent to the charge storage regions of the memory cells. For example, charge traps could form in the tunnel dielectric between the charge storage region and the channel. In view of the foregoing, data retention may be shorter if the memory cells have been cycled many times.

The most significant shift in the $V_T$ distribution of the four cases is depicted in FIG. 9B, which shows $V_T$ distribution shift due to a heating event for a cycled block. In that case, first the block containing the memory cells was cycled many times. For example, the block may have been cycled thousands of times. $V_T$ distribution 912 is for the cycled block of memory cells just after programming. $V_T$ distribution 914 shows the effect of a heating event. Thus, the $V_T$ distribution shifts to a lower $V_T$ as a result of the heating event. Note that the lower tail of the $V_T$ distribution shifts downward. However, the upper tail of the $V_T$ distribution is not necessarily impacted nearly as much.

The next most significant shift in the $V_T$ distribution of the four cases in depicted in FIG. 9A, which shows $V_T$ distribution shift due to a heating event for a non-cycled (or "fresh") block. In that case, the block containing the memory cells was not cycled many times prior to programming to arrive. $V_T$ distribution 902 is for the fresh block of memory cells just after programming. $V_T$ distribution 904 shows the effect of a heating event. Thus, the $V_T$ distribution shifts to a lower $V_T$ as a result of the heating event. However, because the block was not cycled many times, the effect of the heating event is less than for the case depicted in FIG. 9B. Thus, by cycling the block many times prior to programming it to the $V_T$ distribution, the effect of the heating event can be accentuated, which aids detection of the heating event. Moreover, cycling helps to distinguish between the effect of the heating event and the effect of the data retention issue.

As noted, FIGS. 9C and 9D each show shifts associated with data retention issues without a heating event. $V_T$ distribution 922 in FIG. 9C is the threshold voltage distribution just after programming for a fresh block. $V_T$ distribution 924 shows the shift that occurs after a period of time (e.g., one year) due to the data retention issue. $V_T$ distribution 932 in FIG. 9D is the threshold voltage distribution just after programming for a cycled block. $V_T$ distribution 934 shows the shift that occurs after a period of time (e.g., one year) due to the data retention issue for the cycled block. The length of time for the data retention issue is the same for FIGS. 9C and 9D. The effect of cycling the block is to increase the downward shift in the threshold voltage distribution as a result of the data retention issue.

Note that $V_T$ distributions 904 and 914 (FIGS. 9A and 9B, respectively) represent the effect of the heating event occurring shortly after the programming occurred. Hence, $V_T$ distributions 904 and 914 do not include a shift that would occur over time due to data retention issues. If those blocks were left for say, one year, there could be an additional downward shift to the $V_T$ distributions 904 and 914 due to the data retention issue. However, this additional downward shift might not significantly add to the shift due to the heating event.

As noted above, cycling the block can help to distinguish between a heating event and the data retention issue. This is because cycling the block can increase the margin between the two cases. For example, cycling the block can increase the margin between the $V_T$ distributions shifts for the heating event and the data retention issue. First the situation in which the block is not cycled will be discussed (recall that FIGS. 9A and 9C are without cycling). A comparison of FIGS. 9A and 9C shows that without cycling the shift due to the heating event may be larger than the shift due to the data retention issue. However, if for some reason the shift due to the data retention issue were larger, the margin could be too small to safely distinguish one effect from the other. The shift due to the data retention issue in FIG. 9C might be larger if, for example, the memory device sat for a longer time than expected or if the environmental conditions were hotter than expected.

A comparison of FIGS. 9B and 9D shows that with cycling the shift due to the heating event is larger than the shift due to the data retention issue. In each case, the shift may be larger relative to the corresponding non-cycled blocks. However, cycling may accentuate the heating event shift more than the shift due to data retention. Hence, the heating event can more accurately be distinguished from the data retention issue. Even if the data retention issue results in a significantly larger shift than shown in FIG. 9D, the heating event for the cycled block can still be accurately distinguished from the data retention issue for the cycled block.

Figure 10:
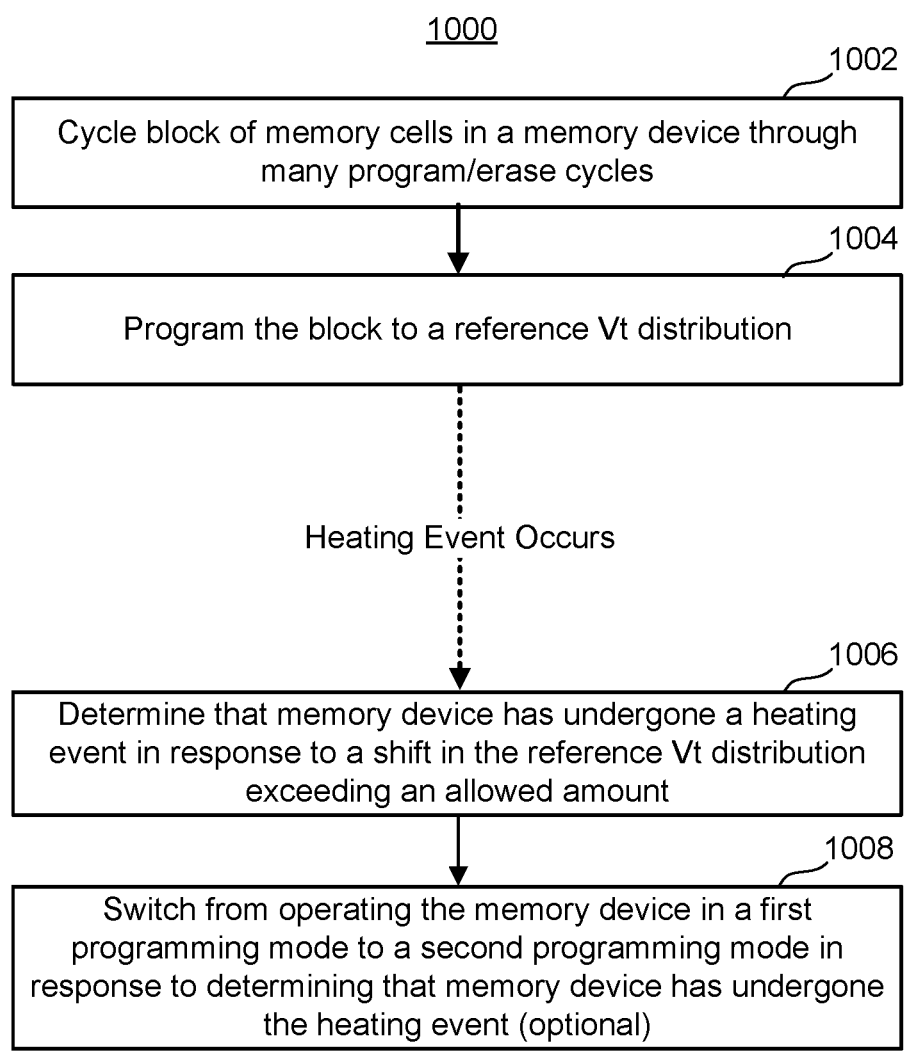
FIG. 10 is a flowchart of one embodiment of a process of self-detecting that a heating event has occurred to a memory device.

FIG. 10 is a flowchart of one embodiment of a process 1000 of a memory device self-detecting that a heating event has occurred. The memory device has a 3D memory array in one embodiment. The memory device has a 2D memory array in one embodiment. The memory array contains NAND strings, in one embodiment. The process 1000 is performed by the managing circuit of FIG. 2, in one embodiment.

In step 1002, a block of memory cells in the memory device is subjected to a number of program/erase cycles. Step 1002 can alternate between applying the erase process 500 of FIG. 5 and the program process 600 of FIG. 6. However, a different erase process, as well as a different program process, could be used. The number of program/erase cycles is sufficient to accentuate the impact of a heating event, in one embodiment. This may also accentuate the impact of the data retention issue. However, the impact of the heating event may be accentuated more than the impact of the data retention issue. The number of program/erase cycles that are used may depend on the nature of the memory device. For some devices, thousands of program/erase cycles may be performed. The program/erase cycles may create physical changes to the memory device, such as creating charge traps in dielectric layers adjacent to the charge storage regions of memory cells. Thus, in one embodiment, step 1002 includes creating charge traps in dielectric layers adjacent to the charge storage regions of memory cells. In one embodiment, step 1002 includes creating physical wear to the block.

Step 1004 includes programming at least a portion of the cycled block to a reference $V_T$ distribution. All of the memory cells in the block might be programmed to the reference $V_T$ distribution. Alternatively, a subset of the memory cells in the block might be programmed to the reference $V_T$ distribution. In one embodiment, memory cells associated with word lines in the middle layers of a stack in a 3D NAND memory array are programmed to the reference $V_T$ distribution.

Referring to FIGS. 8A-8B, the F-state can be used for the reference $V_T$ distribution. Thus, in this example the programming process 600 of FIG. 6 might be used in which the verify level in step 606 is VvF. States such as the F-state that have higher magnitude threshold voltages might show a larger $V_T$ distribution shift, at least for some memory devices. However, another data state could be used. The reference $V_T$ distribution could be one associated with storing one-, two-, three-, or more bits per memory cell. The reference $V_T$ distribution is not required to be associated with a particular data state. Therefore, the verify level for the reference $V_T$ distribution does not need to be one of the verify levels used for with a particular data state used to store data.

There is a dashed line between step 1004 and 1006, indicating that some indeterminate amount of time may pass between these steps. During this time, charge may be lost from the memory cells that were programmed in step 1004 due to the data retention issue. Since the time that passes is indeterminate, the exact amount of charge loss (and hence shift to the reference $V_T$ distribution) is difficult to predict. In one embodiment, an assumption is made as to an upper limit of the shift to the reference $V_T$ distribution due to the data retention issue. This may be based on an assumption as to the maximum length of time that the memory device is allowed to go prior to the heating event. For example, the manufacturer of the memory device may instruct the purchaser to install the memory device into a host device (thereby causing an IR reflow event) within a certain time from either manufacture or purchase.

For the purpose of discussion it will be assumed that a heating event occurs sometime between step 1004 and 1006. This is indicated by the label "Heating Event Occurs" on the dashed line between step 1004 and 1006. This event does not have a reference number assigned to it in order to emphasize that this is not a step in the process 1000. That is, steps 1002, 1004, 1006, and 1008 are all actions that may be performed by the memory device. However, the memory device does not necessarily cause the heating event. Rather, the memory device may be subjected to the heating event.

Step 1006 includes determining that the memory device has undergone a heating event in response to a shift in the reference $V_T$ distribution exceeding an allowed amount. Numerous embodiments of how to detect the heating event are discussed with respect to FIGS. 12-17B.

In response to determining that the memory device has undergone the heating event, the memory device may switch its programming mode. In optional step 1008, the memory device switches from operating in a first programming mode to a second programming mode in response to determining that the memory device has undergone the heating event.

In one embodiment, the first programming mode is a safe mode and the second programming mode is a normal mode. The safe mode could store just one bit per memory cell, as opposed to multiple bits per memory cell. It is also possible for the safe mode to store more than one bit per memory cell. If so, programming in the safe mode could include creating larger margins between $V_T$ distributions than in the normal mode. For example, referring to FIG. 8A, the margin between the lower tail of one $V_T$ distribution and the upper tail of the next lower $V_T$ distribution can be made greater in the safe mode than the normal mode. It may take more time to program in the safe mode to achieve the larger margins.

In one embodiment, step 1008 includes re-writing memory cells at a higher density. For example, information such as an operating system may have been programmed as a single bit per memory cell when the device was manufactured. Such information is re-stored as multiple bits per memory cell, in one embodiment of step 1008.

Figure 11:
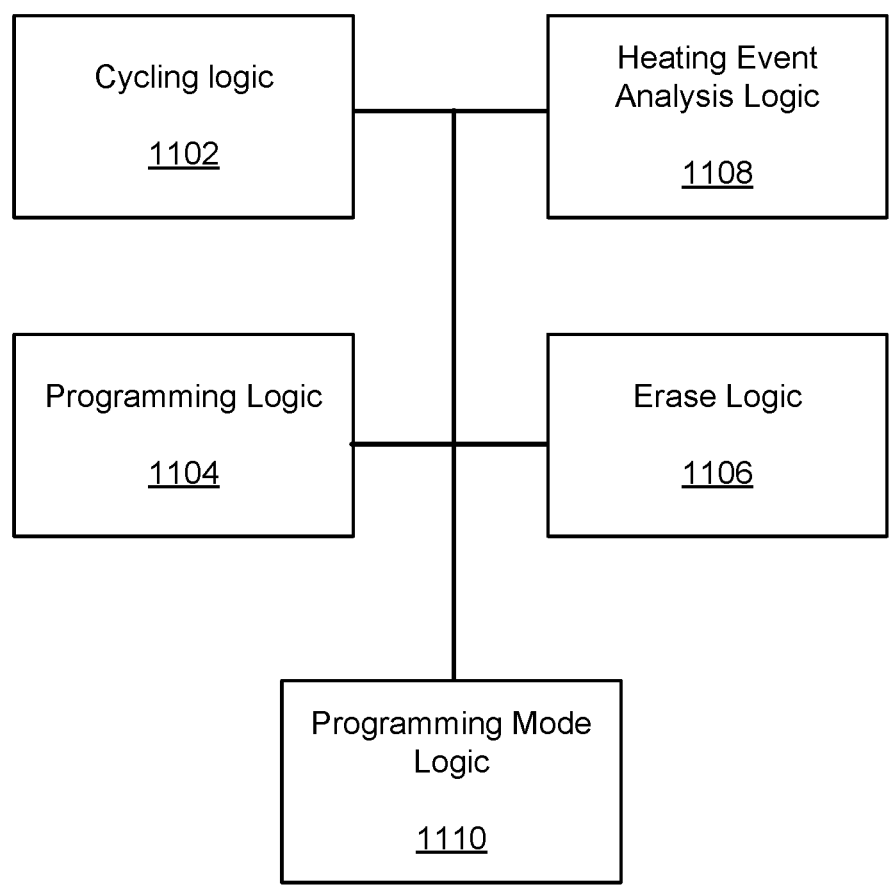
FIG. 11 is a block diagram of one embodiment of a memory device, which is able to self-detect a heating event to the memory device.

FIG. 11 is a block diagram of one embodiment of a memory device, which is able to self-detect a heating event to the memory device. The memory device comprises cycling logic 1102, programming logic 1104, erase logic 1106, heating event analysis logic 1108, and programming mode logic 1110. In one embodiment, the components in FIG. 11 perform the process 1000 of FIG. 10.

The cycling logic 1102 is configured to apply program/erase cycles to a group of memory cells, such as a block of memory cells. The cycling logic 1102 might perform the process 500 of FIG. 5 to erase and the process 600 of FIG. 6 to program; but is not limited to those processes. The cycling logic 1102 could be implemented by control circuitry 110, read/write circuits 128, controller 122, state machine 112, power control 116, and/or processor 122c (see FIG. 2).

The programming logic 1104 is configured to program memory cells. The programming logic 1104 might perform the process of FIG. 6, but is not limited thereto. The programming logic 1104 could be implemented by control circuitry 110, read/write circuits 128, controller 122, state machine 112, power control 116, and/or processor 122c.

The erase logic 1106 is configured to erase memory cells. The erase logic 1106 might perform the process of FIG. 5, but is not limited thereto. The erase logic 1106 could be implemented by control circuitry 110, read/write circuits 128, controller 122, state machine 112, power control 116, and/or processor 122c.

The heating event analysis logic 1108 is configured to detect that the memory device has undergone a heating event in response to a shift in the reference threshold voltage distribution being more than an allowed amount. The heating event analysis logic 1108 could be implemented by control circuitry 110, read/write circuits 128, controller 122, state machine 112, power control 116, and/or processor 122c.

The programming mode logic 1110 is configured to switch from operation the memory device in a first programming mode to a second programming mode in response to detecting the heating event. The first mode may be a safe mode and the second mode may be a normal mode, as described herein. The programming mode logic 1110 could be implemented by control circuitry 110, read/write circuits 128, controller 122, state machine 112, power control 116, and/or processor 122c.

In one embodiment of the memory device of FIG. 11, processor 122c executes code stored in ROM 122a and/or RAM 122b (see FIG. 2). Alternatively or additionally, processor 122c can access code from a storage device in the memory structure, such as a reserved area of memory cells connected to one or more word lines. In one embodiment, state machine 112 is programmable by software stored in code and parameter storage 113 (see FIG. 2). In other embodiments, state machine 112 does not use software and is completely implemented in hardware (e.g., electronic circuits).

There are numerous ways in which the memory device can self-detect, based on a shift in a reference $V_T$ distribution, that a heating event has occurred to a memory device. FIG. 12 is a flowchart of one embodiment of a process 1200 for determining, in response to a shift in a reference $V_T$ distribution, that a heating event has occurred to a memory device. In process 1200 the determination is based on comparing a metric for the shifted reference $V_T$ distribution with a pre-determined criterion. Process 1200 is one embodiment of step 1006 of FIG. 10. Thus, one technique for producing the cycled block that is referred to in process 1200 is to perform steps 1002 and 1004 of FIG. 10. Process 1200 is performed by managing circuit of FIG. 2, in one embodiment. Process 1200 is performed by components of the memory device of FIG. 11, in one embodiment.

In step 1202, a metric is determined for the shifted reference $V_T$ distribution. Examples of the metric include, but are not limited to, a count of memory cells that have a $V_T$ below a certain voltage, a lower tail of the shifted reference $V_T$ distribution, and a measure of central tendency of the shifted reference $V_T$ distribution. The measure of central tendency could include a statistical mean, statistical median, etc.

Step 1204 is to compare the metric for the shifted reference $V_T$ distribution with some pre-determined criterion. The pre-determined criterion may be a value that indicates whether or not the heating event has occurred to the memory device. The pre-determined criterion may be the number of memory cells that are allowed to have a $V_T$ below some reference voltage. If too many memory cells have a $V_T$ below the reference voltage this indicates that a heating event has occurred. The pre-determined criterion may be a voltage associated with the lower tail of the shifted reference $V_T$ distribution. The pre-determined criterion may be a voltage that characterizes a measure of central tendency of the shifted reference $V_T$ distribution. If the lower tail or the measure of central tendency is too low (e.g., the lower tail voltage or mean voltage is lower than allowed) this indicates that a heating event has occurred. FIGS. 15A-17B provide further details on how the metric for the shift in the reference $V_T$ distribution may be compared to a pre-determined criterion.

In one embodiment, the determination of whether the heating event occurred is based on a comparison of a metric for the reference $V_T$ distribution just after programming with that metric after the reference $V_T$ distribution has shifted some time later. This technique can reduce or eliminate some device to device variation due to, for example, semiconductor fabrication process variation. FIG. 13 is a flowchart of one embodiment of a process 1300 for determining that a heating event has occurred to a memory device based on a comparison of a metric for the reference $V_T$ distribution just after programming with that metric after the reference $V_T$ distribution has shifted some time later.

In step 1302, a metric is calculated for the reference $V_T$ distribution just after programming. This metric may be performed just after step 1004 in FIG. 10 is completed. Example metrics are those that define some point on the reference $V_T$ distribution. The point might be a lower tail, a measure of central tendency, etc. The metric is stored in non-volatile storage in step 1304.

A dashed line is indicated between steps 1304 and 1306 to indicate that some time may pass between these steps. Step 1306 includes calculating the metric for the reference $V_T$ distribution some time after programming. Step 1308 is to compare the two metrics. Steps 1306-1308 may be performed as part of one embodiment of step 1006 of FIG. 10. One example of the comparison is to subtract the metric for the shifted reference $V_T$ distribution from the metric from just after programming. The result may be compared to a threshold to determine whether the shift in the reference $V_T$ distribution is more than allowed. A shift that is more than allowed indicates that a heating event has occurred. FIGS. 16A-17B provide further details on how the shifts may be compared.

Another possibility for making the determination of whether the heating event occurred to the memory device is based on a comparison of some metric for the cycled reference $V_T$ distribution with a reference $V_T$ distribution for a fresh block. FIG. 14 is a flowchart of one embodiment of a process 1400 that determines whether a heating event occurred based on a comparison of a shift in the reference $V_T$ distribution for a cycled block with a shift in the reference $V_T$ distribution in a fresh block.

The process 1400 begins in a similar manner as the process 1000 of FIG. 10, with cycling a block of memory cells (step 1002) and programming the cycled block to a reference $V_T$ distribution. Process 1400 adds a step of programming a fresh block to the reference $V_T$ distribution (step 1406). Step 1406 includes programming at least a portion of the fresh block to a reference $V_T$ distribution. All of the memory cells in the fresh block might be programmed to the reference $V_T$ distribution. Alternatively, a subset of the memory cells in the fresh block might be programmed to the reference $V_T$ distribution.

Programming the fresh block (or a group of memory cells in the fresh block) to the reference $V_T$ distribution may include using the process of FIG. 6 with the same verify reference level (see step 606) that was used for the cycled block. Also, the program voltage may be initiated to the same value for the cycled and fresh blocks (see step 602). Furthermore, the same step size may be used in step 616 for the cycled and fresh blocks. In this manner, the fresh and cycled blocks may be programmed to the same reference $V_T$ distribution. Of course, there may be some differences in the two $V_T$ distributions due to, for example, the impact that cycling has on the dielectric materials in the memory cells. A dashed line is shown between step 1406 and 1408 to indicate a substantial gap in time may occur.

In step 1408, the memory device determines that a heating event has occurred based on a comparison of a shift in the reference $V_T$ distribution in the cycled block with a shift in the reference $V_T$ distribution in the fresh block. Step 1408 is one embodiment of step 1006 of FIG. 10. In one embodiment, step 1408 includes comparing a point on the reference $V_T$ distribution in the cycled block with the "same point" on the reference $V_T$ distribution in the fresh block. This point may be defined based on a metric such as a lower tail, statistical mean, statistical median, etc. FIGS. 16A-17B provide further details on how the shifts may be compared.

Figure 15A:
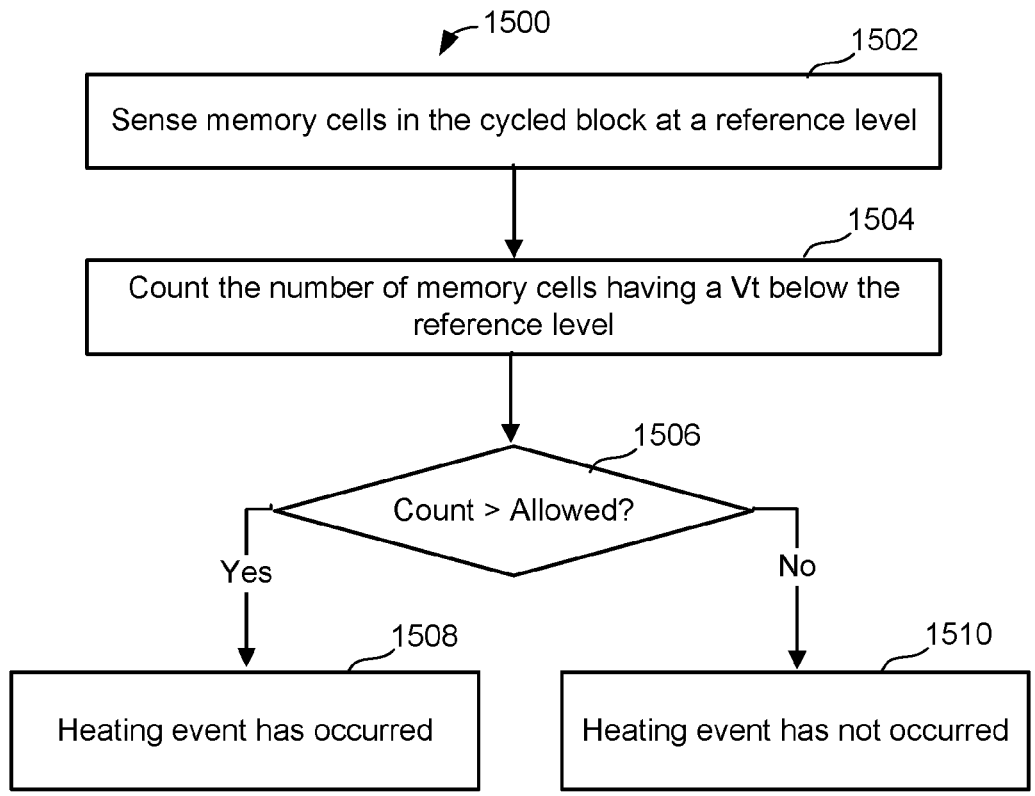
FIG. 15A is a flowchart of one embodiment of a process for determining whether a heating event has occurred based on a count of the number of memory cells that have a $V_T$ below a certain voltage.

FIG. 15A is a flowchart of one embodiment of a process 1500 for determining that a heating event has occurred. In process 1500 the determination is based on a count of the number of memory cells that have a $V_T$ below a certain voltage. Process 1500 is one embodiment of step 1006 of FIG. 10. Thus, one technique for producing the cycled block that is referred to in process 1500 is to perform steps 1002 and 1004 of FIG. 10. Process 1500 is performed by managing circuit of FIG. 2, in one embodiment. Process 1500 is performed by components of the memory device of FIG. 11, in one embodiment.

In step 1502, memory cells in the cycled block are sensed at a reference level (e.g., a specified voltage level). The reference level is associated with an amount of shift that indicates a heating event has occurred, in one embodiment. Any convenient set of memory cells can be selected for the sensing operation. In one embodiment, memory cells in middle layers of a stack are sensed. For example, referring to FIG. 4B, the stack has word line layer WLL0-WLL31 (with a few other layers above and below). Step 1502 might select a word line in a layer roughly at the middle of the range WLL0-WLL31. Of course, a word line at any of the layers (e.g., WLL0-WLL31) could be selected. Also, step 1502 could select multiple word lines (e.g., word lines at different layers). Sensing the memory cells may include applying a reference voltage to the selected word line and sensing bit lines connected to the respective memory cells.

In step 1504, a count that represents the number of memory cells that have a $V_T$ below the reference level is made. Note that counting may stop when the number of memory cells having a $V_T$ below the reference level reaches an allowed number.

Figure 15B:
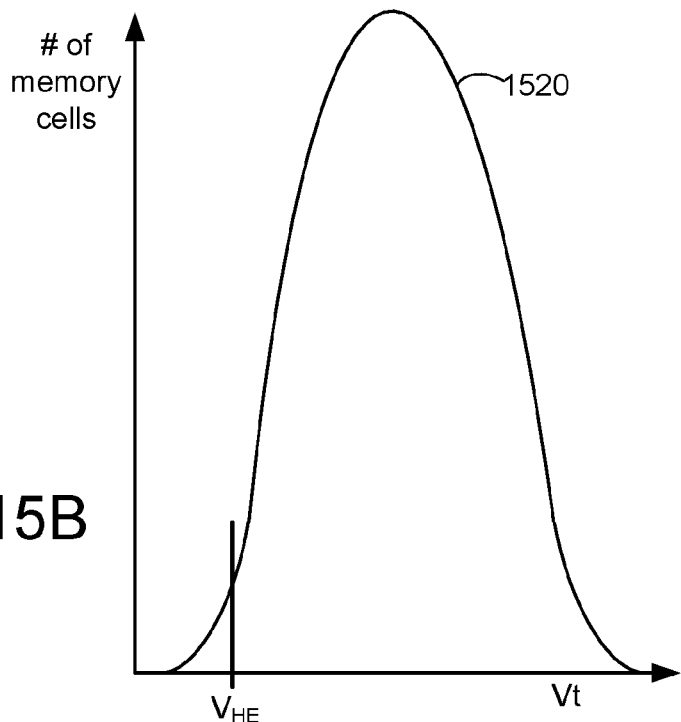
FIG. 15B shows a reference $V_T$ distribution at the time that the memory cells were sensed in step 1502 of the process of FIG. 15A.

In step 1506, a determination is made whether the count is greater than the allowed number of memory cells. FIG. 15B will be referred to in order to illustrate one example. FIG. 15B shows a reference $V_T$ distribution 1520 at the time that the memory cells were sensed in step 1502. Thus, the reference $V_T$ distribution 1520 may have shifted downward relative to its state immediately after programming (in, for example, step 1004 of FIG. 10). Voltage level $V_{HE}$ is the reference level, in this example. The count is for memory cells having a $V_T$ that is less than $V_{HE}$.

If the count is greater than the allowed amount, then the memory device determines that a heating event has occurred (step 1508). If the count is not greater than the allowed amount, then the memory device determines that a heating event has not occurred (step 1510).

In one embodiment, the count of allowed memory cells is a pre-determined number (or a "specified number"). For example, an expected count may be determined based on a study of an expected amount of shift in the reference $V_T$ distribution for a heating event. In one embodiment, the count is high enough to distinguish the heating event from a data retention issue. Thus, the count may be high enough to not have a false positive for a data retention issue, but low enough to not miss a heating event. Recall that process 1200 of FIG. 12 is a general flow for detecting a heating event based on a pre-determined criterion. Process 1500 may be used in one embodiment of process 1200. However, it is not required that the count of allowed memory cells in step 1506 of FIG. 15 be a pre-determined number.

In some embodiments, to detect a heating event the memory device performs an analysis based on some point on the reference $V_T$ distribution. The point is a lower tail, in one embodiment. The lower tail refers to some point at the lower end of the reference $V_T$ distribution. The lower tail could be based on a certain percentile of the memory cells. For example, the lower tail could be defined as the voltage at which 0.15% of the memory cells fall below. The lower tail could be defined based on an assumption of the shape of the reference $V_T$ distribution. For example, it might be assumed that the reference $V_T$ distribution has a Gaussian distribution. The lower tail could be defined as the lower 3 sigma ("3σ") point on the reference $V_T$ distribution, assuming a Gaussian distribution. Another possibility is to define the point on some measure of central tendency. Examples of central tendencies include, but are not limited to, a statistical mean and a statistical median.

Figure 16A:
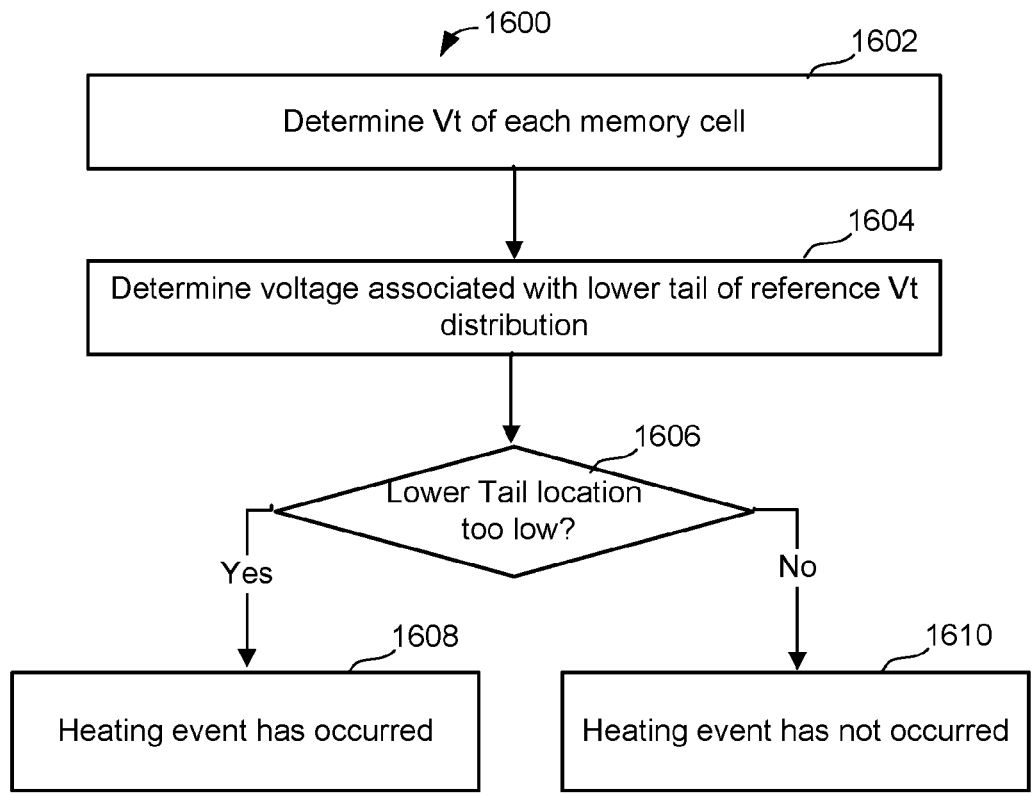
FIG. 16A is a flowchart of one embodiment of a process for determining whether a heating event has occurred based on a location of the lower tail of the reference $V_T$ distribution.

FIG. 16A is a flowchart of one embodiment of a process 1600 for determining that a heating event has occurred to a memory device based on a shift in a reference $V_T$ distribution. In process 1600 the determination is based on a location of the lower tail of the reference $V_T$ distribution. Process 1600 is one embodiment of step 1006 of FIG. 10. Thus, one technique for producing the cycled block that is referred to in process 1200 is to perform steps 1002 and 1004 of FIG. 10. Process 1600 is performed by managing circuit of FIG. 2, in one embodiment. Process 1600 is performed by components of the memory device of FIG. 11, in one embodiment.

In step 1602, the memory device determines a $V_T$ of each memory cell in a selected group. The discussion of step 1502 in FIG. 15A with respect to selection of what memory cells to sense applies also to step 1602. Step 1602 may include sensing the memory cells at a range of voltages that covers an expected range of the vast majority of the reference $V_T$ distribution. There may be a small voltage gap between the various sensing levels. Hence, the memory cells can be placed into "bins," each of which actually covers a small range of threshold voltages.

Figure 16B:
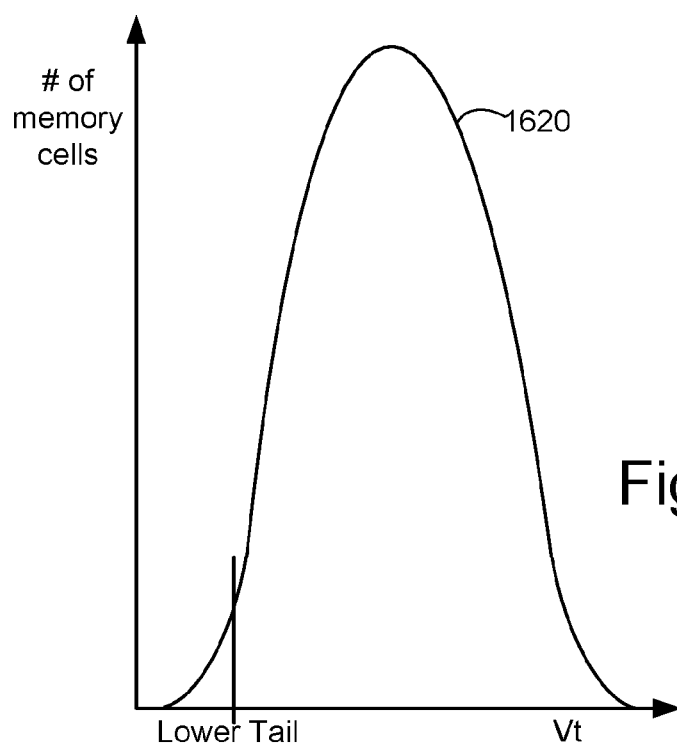
FIG. 16B shows a reference $V_T$ distribution at the time that the memory cells were sensed in step 1602 of the process of FIG. 16A.

In step 1604, a voltage associated with the lower tail of the reference $V_T$ distribution is determined. FIG. 16B will be referred to in order to illustrate one example. FIG. 16B shows a reference $V_T$ distribution 1620 at the time that the memory cells were sensed in step 1602. Thus, the reference $V_T$ distribution 1620 may have shifted downward relative to its state immediately after programming (in, for example, step 1004 of FIG. 10). The point marked "Lower Tail" defines the location of the lower tail of reference $V_T$ distribution 1620. Memory cells having a $V_T$ equal to or less than the voltage at the Lower Tail point are in the lower tail of reference $V_T$ distribution 1620. In step 1604, a voltage associated with those memory cells is determined. One way to determine this voltage is to determine a statistical mean of the threshold voltages of memory cells in the Lower Tail. Another way to determine this voltage is to use the voltage at the point marked Lower Tail.

In step 1606, the memory device determines whether the location of the Lower Tail is too low. The memory device may compare the voltage associated with the Lower Tail to a voltage that is based on an amount of allowed shift of the reference $V_T$ distribution 1620.

If the Lower Tail is too low, then the memory device determines that a heating event has occurred (step 1608). If the Lower Tail is not too low, then the memory device determines that a heating event has not occurred (step 1610).

In one embodiment, the allowed lower tail location is pre-determined. This could be a voltage. For example, the allowed lower tail location may be determined based on a study of an expected amount of shift in the lower tail of the reference $V_T$ distribution for a heating event. The pre-determined lower tail location may be between a location of an expected worst case shift for data retention loss and an expected best case (less shift) for a heating event. In this manner, the process can distinguish between a heating event and a data retention issue. Referring back to FIG. 12, in one embodiment, the metric is the lower tail of the reference $V_T$ distribution. Thus, process 1600 may be used in one embodiment of process 1200. In this case, the allowed tail location in step 1606 is based on the pre-determined location for the lower tail that indicates a heating event has occurred.

In one embodiment, the allowed lower tail location in step 1606 is based on a location of the lower tail of the reference $V_T$ distribution for the cycled block just after programming. Recall the process 1300 calculated a metric for the reference $V_T$ distribution just after programming. In one embodiment, that metric is for a lower tail location. Thus, process 1600 may be used in one embodiment of process 1300. In step 1302 of FIG. 13, the lower tail of the reference $V_T$ distribution is the metric determined just after programming. Some metric for the lower tail may be stored in non-volatile storage. This may be the same metric that will be calculated in step 1604 of FIG. 16A. Step 1604 in FIG. 16A is one embodiment of step 1306 in FIG. 13. Step 1606 in FIG. 16A is one embodiment of step 1308 in FIG. 13. In this embodiment of step 1606, the lower tail for the reference $V_T$ distribution just after programming is compared to the lower tail for the reference $V_T$ distribution from step 1604.

Equation 1 provide one example of how to compare the two lower tails. $LT_P$ refers to some metric that defines the lower tail for the reference $V_T$ distribution for the cycled block just after programming. Note that this was determined in step 1302. $LT_S$ refers to some metric that defines the lower tail for the shifted reference $V_T$ distribution for the cycled block at step 1306. If the result is greater than the threshold, then a heating event has occurred (step 1608). Otherwise, a heating event has not occurred (step 1610).

$$LT_P - LT_S > \text{Threshold} \quad (1)$$

In one embodiment, the allowed lower tail location in step 1606 of FIG. 16A is based on a shift in the location of the lower tail of a reference $V_T$ distribution for a fresh block. Recall that FIG. 14 describes a general flow for such a process. Thus, process 1600 may be used in one embodiment of process 1400 in which the shifts in reference $V_T$ distributions are based on lower tail location. In step 1408 of FIG. 14, the lower tail of the fresh block is determined along with determining the lower tail of the cycled block. Then, these two lower tails are compared with each other.

Equations 2 and 3 provide one example of how to compare the two lower tails. LTR refers to some metric that defines the lower tail for the reference $V_T$ distribution for the cycled block. Note that this was determined in step 1604 of FIG. 16A. LTF refers to some metric that defines the lower tail for the reference $V_T$ distribution for the fresh block. This is determined at the same time that LTR is determined, in one embodiment.

$$\frac{LTR}{LTF} - 1 > LTthr \quad (2)$$

$$\frac{LTR}{LTF} - 1 < LTthr \quad (3)$$

Equation 2 represents a condition for which the shift is more than allowed, which indicates a heating event has occurred (step 1608). Equation 3 represents a condition for which the shift is not more than allowed, which indicates a heating event has not occurred (step 1610. The value for LTthr is set high enough to avoid a false positive for a data retention issue, but low enough to detect the heating event, in one embodiment. Of course, there are other ways in which the compare the shift in lower tails of the fresh and cycled blocks.

Another way to analyze the shift in the reference $V_T$ distribution is to analyze a measure of central tendency. Examples of central tendencies include, but are not limited to, a statistical mean and a statistical median. FIG. 17A is a flowchart of one embodiment of a process 1700 for determining that a heating event has occurred in response to a shift in a reference $V_T$ distribution. In process 1700 the determination is based on a location of a measure of central tendency of the reference $V_T$ distribution. Process 1700 is one embodiment of step 1006 of FIG. 10. Thus, one technique for producing the cycled block that is referred to in process 1200 is to perform steps 1002 and 1004 of FIG. 10. Process 1700 is performed by managing circuit of FIG. 2, in one embodiment. Process 1700 is performed by components of the memory device of FIG. 11, in one embodiment.

In step 1702, the memory device determines a $V_T$ of each memory cell in a selected group. The discussion of step 1502 in FIG. 15A with respect to selection of what memory cells to sense applies also to step 1702. Step 1702 may be similar to step 1602 of FIG. 16A.

In step 1704, a voltage associated with a measure of central tendency of the reference $V_T$ distribution is determined. FIG. 17B will be referred to in order to illustrate one example. FIG. 17B shows a reference $V_T$ distribution 1720 at the time that the memory cells were sensed in step 1702. Thus, the reference $V_T$ distribution 1720 may have shifted downward relative to its state immediately after programming (in, for example, step 1004 of FIG. 10). The point marked "Central Tendency" defines the location of the Central Tendency of reference $V_T$ distribution 1720. One way to determine this voltage is to determine a statistical mean of the threshold voltages of memory cells in the reference $V_T$ distribution 1720. One way to determine this voltage is to determine a statistical median of the threshold voltages of memory cells in the reference $V_T$ distribution 1720. In one embodiment, the reference $V_T$ distribution 1720 is expected to have a Gaussian distribution (noting that in the real world the data may not conform exactly to a Gaussian distribution). With this Gaussian assumption, the statistical median may be expected to be equal to the statistical mean.

In step 1706, the memory device determines whether the voltage of the measure of central tendency is less than an allowed voltage.

If the measure of central tendency is less than the allowed voltage, then the memory device determines that a heating event has occurred (step 1708). If the measure of central tendency is not less than the allowed voltage, then the memory device determines that a heating event has not occurred (step 1710).

The following describes further details of one embodiment of process 1700. Equation 4 describes one way to calculate a measure of central tendency. This may be used in step 1704. In this embodiment, memory cells may be placed into "bins" that each contain memory cells in some threshold voltage range. In this example, there are "m" bins.

$$\mu_F = \frac{\sum_{i=1}^{m} V_i * Y_i}{\sum_{i=1}^{m} y_i} \qquad (4)$$

In Equation 4, $\mu_F$ is the measure of central tendency of a cycled block, $V_i$ is the threshold voltage for the $i_{th}$ bin, and $y_i$ is the number of memory cells in the $i_{th}$ bin.

In one embodiment, the allowed location of the measure of central tendency is pre-determined. For example, the allowed location of the measure of central tendency may be determined based on a study of an expected amount of shift in the location of the measure of central tendency of the reference $V_T$ distribution for a heating event. Thus, process 1700 may be used in one embodiment of process 1200. The criterion for selecting the allowed location of the measure of central tendency may be similar to selecting the allowed location of the lower tail discussed above with respect to FIG. 16A.

In one embodiment, the allowed location of the measure of central tendency is based on a location of the measure of central tendency of the reference $V_T$ distribution for the cycled block just after programming. Recall the process 1300 calculated a metric for the reference $V_T$ distribution just after programming. In one embodiment, that metric is for a measure of central tendency. Thus, process 1700 may be used in one embodiment of process 1300. Thus in one embodiment of step 1302, the location of the measure of central tendency of the reference $V_T$ distribution is determined just after programming. Some metric for the location of the measure of central tendency is stored in non-volatile storage in step 1304. This may be the same metric that will be calculated in step 1704 of FIG. 17A. Step 1704 is one embodiment of step 1306. Step 1706 is one embodiment of step 1308. In step 1706, the location of the measure of central tendency for the reference $V_T$ distribution just after programming is compared to the location of the measure of central tendency for the reference $V_T$ distribution from step 1704.

In one embodiment, the location of the measure of central tendency is based on a location of the location of the measure of central tendency of a shifted reference $V_T$ distribution for a fresh block. Recall that process 1400 is a general flow of such a process. Thus, process 1700 may be used in one embodiment of process 1400. In step 1706 of FIG. 17A, the location of the measure of central tendency of the fresh block is compared to the measure of central tendency of the cycled block. Step 1706 is for the shifted reference $V_T$ distribution for each case.

Equations 5 and 6 describe one way to determine whether the measure of central tendency is less than allowed. These Equations compare the shift in the measure of central tendency for a fresh block with a cycled block. This may be used in step 1706.

$$\frac{\mu R}{\mu F} - 1 > Thr \qquad (5)$$

$$\frac{\mu R}{\mu F} - 1 < Thr \qquad (6)$$

Equation 5 represents a condition for which the shift is more than allowed, which indicates a heating event has occurred (step 1708). Equation 6 represents a condition for which the shift is not more than allowed, which indicates a heating event has not occurred (step 1710). The value of Thr is high enough to avoid a false positive for a data retention issue and low enough to avoid missing the heating event, in one embodiment. Of course, there are other ways in which the measure of central tendency for the fresh block (μR) can be compared with the measure of central tendency for the cycled distribution (μF).

There are other metrics that can be used when determining whether the shift in the reference $V_T$ distribution is more than allowed. One technique is to calculate a metric ("delta") based on a voltage on the reference $V_T$ distribution for a fresh block and a cycled block. In this example, $V_i$ is the voltage on the reference $V_T$ distribution at which a certain number of memory cells have a threshold voltage less than $V_i$. One special case of this is the lower tail discussed herein. Another special case for this is the measure of central tendency discussed herein. Equations 7 and 8 are two more example metrics.

$$\text{Delta} = V_i^R - V_i^S \quad (7)$$

$$\text{Ratio} = (V_i^R / V_i^S) - 1 \quad (8)$$

In Equations 7 and 8, $V_i^R$ is the voltage on the shifted reference $V_T$ distribution for a fresh block. In Equations 7 and 8, $V_i^S$ is the voltage on the shifted reference $V_T$ distribution for a cycled block.

Figure 18:
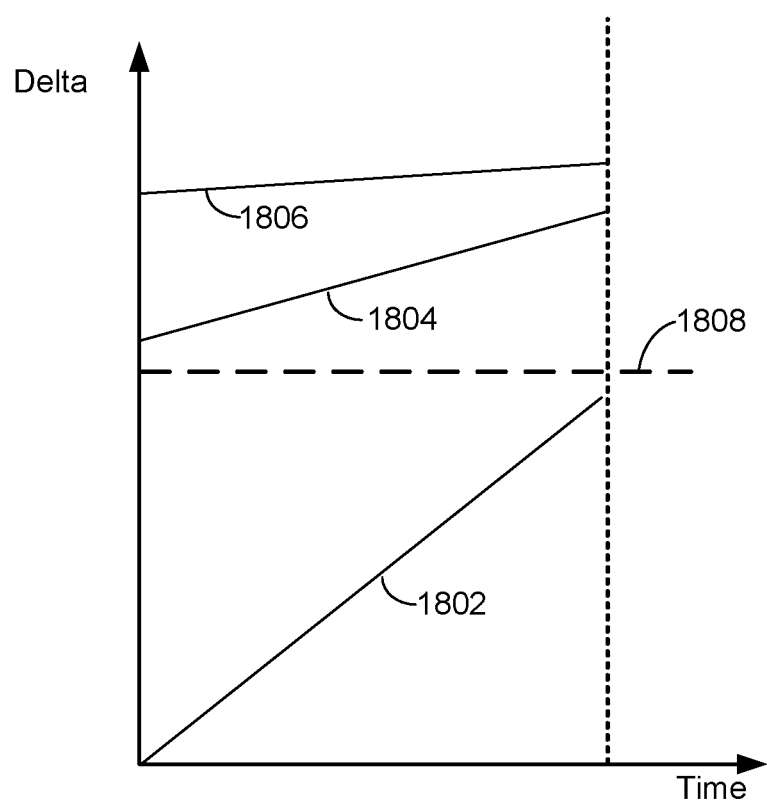
FIG. 18 is a diagram of curves to help illustrate how an allowed amount of shift in the reference $V_T$ distribution can be determined.

FIG. 18 is a diagram of curves of delta from Equation 7 versus time to help illustrate how an allowed amount of shift in the reference $V_T$ distribution can be determined. Curve 1802 represents the case in which there is not a heating event. The curve 1802 starts at zero and increases over due to the charge loss due to the data retention issue. Curve 1804 represents a case in which there is a single heating event. Note that as time increases, there is additional charge loss due to the data retention issue. However, the slope of curve 1804 is less than the slope of curve 1802. Curve 1806 represents a case in which there are three heating events. Note that three heating events creates a larger effect than a single heating event, but does not necessarily result in tripling the effect. Also note that as time increases, there is additional charge loss due to the data retention issue. However, the slope of curve 1806 is less than the slope of curve 1804 (as well as being less than the slope of curve 1802).

Line 1808 represents a threshold that may be used to detect a heating event. Note that an assumption is made to limit the amount of charge loss that can reasonably be expected due to the data retention issue. This limit may be based on an expected amount of time prior to the heating event. The threshold 1808 is high enough to prevent a false positive due to a data retention issue, but low enough to not fail to detect a heating event. Similar curves could be used for other metrics to determine a suitable value for thresholds to detect a heating event.

A cycling means for cycling a block of memory cells in the non-volatile storage device through a plurality of program/erase operations, in various embodiments, may include control circuitry 110, read/write circuits 128, controller 122, state machine 112, power control 116, and/or processor 122c. Processor 122c may execute code stored in ROM 122a and/or RAM 122b. Alternatively or additionally, processor 122c can access code from a storage device in the memory structure, such as a reserved area of memory cells connected to one or more word lines. In one embodiment, state machine 112 is programmable by software stored in code and parameter storage 113. In other embodiments, state machine 112 does not use software and is completely implemented in hardware (e.g., electronic circuits). Other embodiments may include similar or equivalent means for cycling a block of memory cells in the non-volatile storage device through a plurality of program/erase operations.

A programming means for programming a group of the memory cells in the cycled block to a reference threshold voltage distribution after the cycling, in various embodiments, may include control circuitry 110, read/write circuits 128, controller 122, state machine 112, power control 116, and/or processor 122c. Processor 122c may execute code stored in ROM 122a and/or RAM 122b. Alternatively or additionally, processor 122c can access code from a storage device in the memory structure, such as a reserved area of memory cells connected to one or more word lines. In one embodiment, state machine 112 is programmable by software stored in code and parameter storage 113. In other embodiments, state machine 112 does not use software and is completely implemented in hardware (e.g., electronic circuits). Other embodiments may include similar or equivalent programming means for programming a group of the memory cells in the cycled block to a reference threshold voltage distribution after the cycling.

A heating event analysis means for determining that the non-volatile storage device has undergone a heating event in response to a shift in the reference threshold voltage distribution being more than an allowed amount, in various embodiments, may include control circuitry 110, read/write circuits 128, controller 122, state machine 112, power control 116, and/or processor 122c. Processor 122c may execute code stored in ROM 122a and/or RAM 122b. Alternatively or additionally, processor 122c can access code from a storage device in the memory structure, such as a reserved area of memory cells connected to one or more word lines. In one embodiment, state machine 112 is programmable by software stored in code and parameter storage 113. In other embodiments, state machine 112 does not use software and is completely implemented in hardware (e.g., electronic circuits). Other embodiments may include similar or equivalent heating event analysis means for determining that the non-volatile storage device has undergone a heating event in response to a shift in the reference threshold voltage distribution being more than an allowed amount.

A programming mode means for switching from operating the non-volatile storage device in a first programming mode to a second programming mode in response to the determination that the non-volatile storage device has undergone the heating event, in various embodiments, may include control circuitry 110, read/write circuits 128, controller 122, state machine 112, power control 116, and/or processor 122c. Processor 122c may execute code stored in ROM 122a and/or RAM 122b. Alternatively or additionally, processor 122c can access code from a storage device in the memory structure, such as a reserved area of memory cells connected to one or more word lines. In one embodiment, state machine 112 is programmable by software stored in code and parameter storage 113. In other embodiments, state machine 112 does not use software and is completely implemented in hardware (e.g., electronic circuits). Other embodiments may include similar or equivalent means for switching from operating the non-volatile storage device in a first programming mode to a second programming mode in response to the determination that the non-volatile storage device has undergone the heating event memory cells in the cycled block to a reference threshold voltage distribution after the cycling.

One embodiment disclosed herein comprises a non-volatile storage device comprising a plurality of memory cells and managing circuitry in communication with the plurality of memory cells. The managing circuitry is configured to perform a plurality of program/erase cycles on a group of the plurality of memory cells. The managing circuitry is configured to program the cycled group of memory cells to a reference threshold voltage distribution. The managing circuitry is configured to determine that the non-volatile storage device has undergone a heating event in response to a shift in the reference threshold voltage distribution.

One embodiment disclosed herein comprises a method that comprises the following. A block of memory cells in a memory device is cycled through a plurality of program/erase operations. A group of the memory cells in the cycled block are programmed to a reference threshold voltage distribution after the cycling. The memory device detects that the memory device has undergone a heating event in response to a shift in the reference threshold voltage distribution exceeding an allowed amount. The memory device is switched from operating in a first programming mode to a second programming mode in response to the memory device detecting that the memory device has undergone the heating event.

One embodiment disclosed herein comprises a 3D stacked non-volatile storage device comprising a substrate, a three-dimensional memory array that resides above the substrate and managing circuitry. The three-dimensional memory array comprises a plurality of blocks of non-volatile storage elements. The managing circuitry is in communication with the plurality of blocks of non-volatile storage elements. The managing circuitry performs a plurality of program/erase cycles on a block of the non-volatile storage elements. The managing circuitry programs selected non-volatile storage elements in the cycled block to a reference threshold voltage distribution. The managing circuitry detects that the 3D stacked non-volatile storage device has undergone an IR reflow event in response to the reference threshold voltage distribution shifting by more than an amount that is associated with IR reflow event.

One embodiment disclosed herein comprises a non-volatile storage device, comprising cycling means, programming means, heating event analysis means, and programming mode means. The cycling means is for cycling a block of memory cells in the non-volatile storage device through a plurality of program/erase operations. The programming means is for programming a group of the memory cells in the cycled block to a reference threshold voltage distribution after the cycling. The heating event analysis means is for determining that the memory device has undergone a heating event in response to a shift in the reference threshold voltage distribution being more than an allowed amount. The programming mode means is for switching from operating the non-volatile storage device in a first programming mode to a second programming mode in response to the determination that the non-volatile storage device has undergone the heating event.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage device, comprising:
   a plurality of memory cells; and
   managing circuitry in communication with the plurality of memory cells, the managing circuitry configured to perform a plurality of program/erase cycles on a group of the plurality of memory cells, program the cycled group of memory cells to a reference threshold voltage distribution, and determine that the non-volatile storage device has undergone a heating event in response to a shift in the reference threshold voltage distribution.

2. The non-volatile storage device of claim 1, wherein the plurality of memory cells comprises a fresh group that has not undergone a plurality of program/erase cycles, the managing circuitry further configured to program the fresh group to the reference threshold voltage distribution when the memory cells in the cycled group are programmed to the reference threshold voltage distribution, the managing circuitry further configured to determine that the non-volatile storage device has undergone the heating event based on a comparison of a shift in the reference threshold voltage distribution of the fresh group with the shift in the reference threshold voltage distribution of the cycled group.

3. The non-volatile storage device of claim 1, wherein the managing circuitry is further configured to switch from operating the non-volatile storage device in a first programming mode to a second programming mode in response to determining that the non-volatile storage device has undergone the heating event.

4. The non-volatile storage device of claim 3, wherein the first programming mode is a safe mode and the second programming mode is a normal mode.

5. The non-volatile storage device of claim 1, wherein the shift in the reference threshold voltage distribution of the cycled group is that more than an allowed number of memory cells in the cycled group have a threshold voltage below a specified voltage level.

6. The non-volatile storage device of claim 1, wherein the shift in the reference threshold voltage distribution of the cycled group is based on a voltage level that characterizes a point on the reference threshold voltage distribution.

7. The non-volatile storage device of claim 6, wherein the point on the reference threshold voltage distribution is a lower tail.

8. The non-volatile storage device of claim 6, wherein the point on the reference threshold voltage distribution is a measure of central tendency.

9. The non-volatile storage device of claim 1, wherein the heating event is an Infrared (IR) reflow.

10. The non-volatile storage device of claim 1, further comprising a three-dimensional memory array that comprises the plurality of memory cells.

11. A method comprising:
    cycling a block of memory cells in a memory device through a plurality of program/erase operations;
    programming a group of the memory cells in the cycled block to a reference threshold voltage distribution after the cycling;
    detecting, by the memory device in response to a shift in the reference threshold voltage distribution exceeding an allowed amount, that the memory device has undergone a heating event; and
    switching from operating the memory device in a first programming mode to a second programming mode in response to the memory device detecting that the memory device has undergone the heating event.

12. The method of claim 11, further comprising:
    programming a group of memory cells in a fresh block that has not been through a plurality of program/erase operations to the reference threshold voltage distribution when the memory cells in the cycled block are programmed to the reference threshold voltage distribution, the detecting that the memory device has undergone the heating event is based on a comparison of a shift in the reference threshold voltage distribution in the fresh block with the shift in the reference threshold voltage distribution in the cycled block.

13. The method of claim 12, wherein the comparison of the shift in the reference threshold voltage distribution in the fresh block with the shift in the reference threshold voltage distribution in the cycled block comprises either:
   a comparison of a point that characterizes a lower tail on the reference threshold voltage distribution in the fresh block with a point that characterizes a lower tail on the reference threshold voltage distribution in the cycled block; or
   a comparison of a point on the reference threshold voltage distribution in the fresh block that characterizes a central tendency with a point on the reference threshold voltage distribution in the cycled block that characterizes a central tendency.

14. The method of claim 11, wherein the detecting that the memory device has undergone a heating event comprises:
   inferring that the heating event has occurred in response to more than a specified number of memory cells in the group in the cycled block having a threshold voltage below a voltage level that characterizes an Infrared (IR) reflow.

15. The method of claim 11, wherein the detecting that the memory device has undergone a heating event comprises:
   comparing a first metric that characterizes a point on the reference threshold voltage distribution with a second metric that characterizes the same point on the reference threshold voltage distribution at the time the reference threshold voltage distribution was programmed; and
   determining that a difference between the first metric and the second metric exceeds a criterion that indicates solder reflow has occurred.

16. A 3D stacked non-volatile storage device, comprising:
   a substrate;
   a three-dimensional memory array that resides above the substrate, the three-dimensional memory array comprising a plurality of blocks of non-volatile storage elements; and
   managing circuitry in communication with the plurality of blocks of non-volatile storage elements, the managing circuitry performs a plurality of program/erase cycles on a block of the non-volatile storage elements, programs selected non-volatile storage elements in the cycled block to a reference threshold voltage distribution, and detects that the 3D stacked non-volatile storage device has undergone a heating event in response to the reference threshold voltage distribution shifting by more than an amount that is associated with the heating event.

17. The 3D stacked non-volatile storage device of claim 16, wherein the heating event is associated with a soldering temperature.

18. The 3D stacked non-volatile storage device of claim 16, wherein the heating event is an Infrared (IR) reflow event.

19. The 3D stacked non-volatile storage device of claim 16, wherein the heating event is a solder reflow event.

20. A non-volatile storage device, comprising:
   means for cycling a block of memory cells in the non-volatile storage device through a plurality of program/erase operations;
   means for programming a group of the memory cells in the cycled block to a reference threshold voltage distribution after the cycling; and
   means for determining that the non-volatile storage device has undergone a heating event in response to a shift in the reference threshold voltage distribution.

* * * * *